(12) United States Patent
Im et al.

(10) Patent No.: US 12,439,769 B2
(45) Date of Patent: Oct. 7, 2025

(54) PEROVSKITE PHOTOELECTRIC DEVICE AND MANUFACTURING METHOD THEREOF

(71) Applicant: Korea University Research and Business Foundation, Seoul (KR)

(72) Inventors: Sang Hyuk Im, Hwaseong-si (KR); Jin Hyuck Heo, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 872 days.

(21) Appl. No.: 17/633,247

(22) PCT Filed: Aug. 7, 2020

(86) PCT No.: PCT/KR2020/010471
§ 371 (c)(1),
(2) Date: Feb. 7, 2022

(87) PCT Pub. No.: WO2021/025519
PCT Pub. Date: Feb. 11, 2021

(65) Prior Publication Data
US 2023/0225140 A1    Jul. 13, 2023

(30) Foreign Application Priority Data

Aug. 8, 2019  (KR) ........................ 10-2019-0096387

(51) Int. Cl.
*H10K 50/11* (2023.01)
*H10F 71/00* (2025.01)
(Continued)

(52) U.S. Cl.
CPC ............. *H10K 50/11* (2023.02); *H10F 71/00* (2025.01); *H10F 77/12* (2025.01); *H10F 77/169* (2025.01); *H10K 71/12* (2023.02)

(58) Field of Classification Search
CPC ...... H10K 50/11; H10K 71/12; H01L 31/032; H01L 31/0392; H01L 31/18
(Continued)

(56) References Cited

U.S. PATENT DOCUMENTS

2018/0182977 A1    6/2018 Hirose et al.

FOREIGN PATENT DOCUMENTS

| KR | 10-1574658 B1 | 12/2015 |
| KR | 10-2016-0055091 A | 5/2016 |

(Continued)

OTHER PUBLICATIONS

Lee, Jin-Wook, et al. "Verification and mitigation of ion migration in perovskite solar cells." *APL materials* vol. 7. Issue 4 (2019). pp 1-13.
(Continued)

*Primary Examiner* — Anita Nassiri-Motlagh
(74) *Attorney, Agent, or Firm* — NSIP Law

(57) ABSTRACT

The perovskite photoelectric device includes a first electrode; a hole transport layer formed on the first electrode; a perovskite layer formed on the hole transport layer and made of a first perovskite compound; an electron transport layer formed on the perovskite layer; a second electrode formed on the electron transport layer; and a graded wall formed on the hole transport layer and the perovskite layer and made of a second perovskite compound, wherein the first perovskite compound and the second perovskite compound are represented by Formula 1 below, and the graded wall suppresses movement of anions included in the perovskite layer:

$$A_a M_b X_c \quad \text{[Formula 1]}$$

where A is a monovalent cation, M is a divalent or trivalent metal cation, X is a monovalent anion, a+2b=c
(Continued)

when M is a divalent metal cation, a+3B=c when M is a trivalent metal cation, and a, b and c are natural numbers.

10 Claims, 21 Drawing Sheets

(51) Int. Cl.
  *H10F 77/12* (2025.01)
  *H10F 77/169* (2025.01)
  *H10K 71/12* (2023.01)

(58) Field of Classification Search
  USPC .................................................. 252/301.4 H
  See application file for complete search history.

(56) References Cited

FOREIGN PATENT DOCUMENTS

| | | |
|---|---|---|
| KR | 10-1687491 B1 | 12/2016 |
| KR | 10-2017-0028054 A | 3/2017 |
| KR | 10-2017-0060184 A | 5/2017 |
| KR | 10-2017-0079877 A | 7/2017 |
| KR | 10-1755333 B1 | 7/2017 |
| KR | 10-2018-0106851 A | 10/2018 |
| KR | 10-1998021 B1 | 7/2019 |
| WO | WO 2019/074616 A2 | 4/2019 |
| WO | WO 2019/074616 A3 | 4/2019 |

OTHER PUBLICATIONS

Extended European Search Report issued on Jul. 4, 2023, in counterpart European Patent Application No. 20849467.4 (14 pages in English).

[FIG. 1]
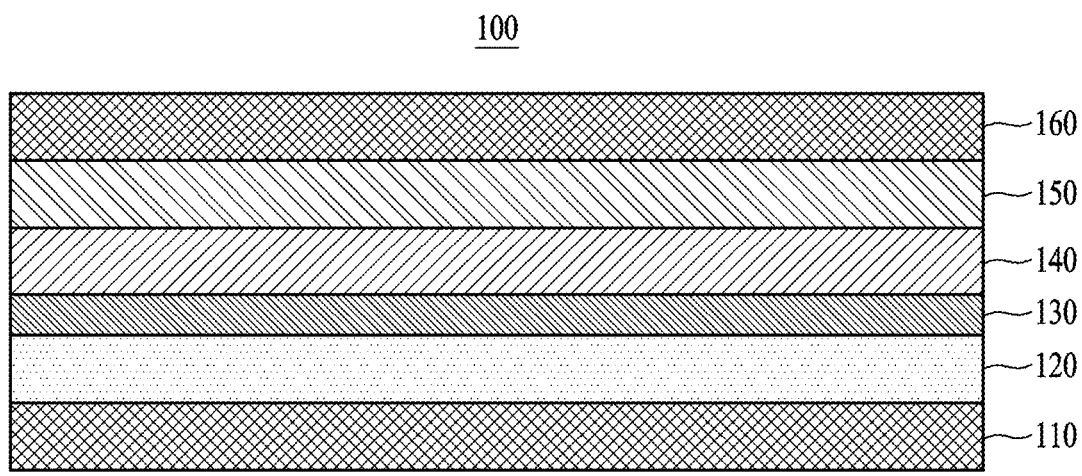

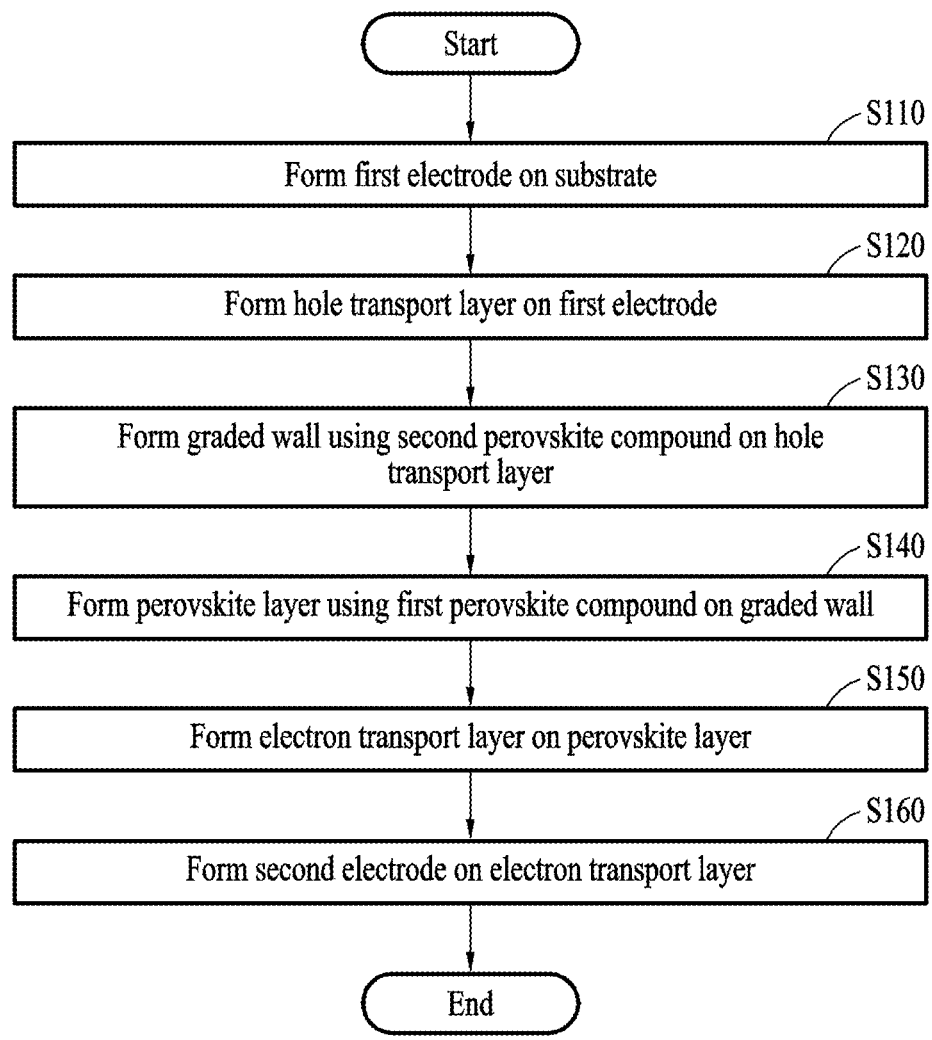
[FIG. 2]

[FIG. 3A]
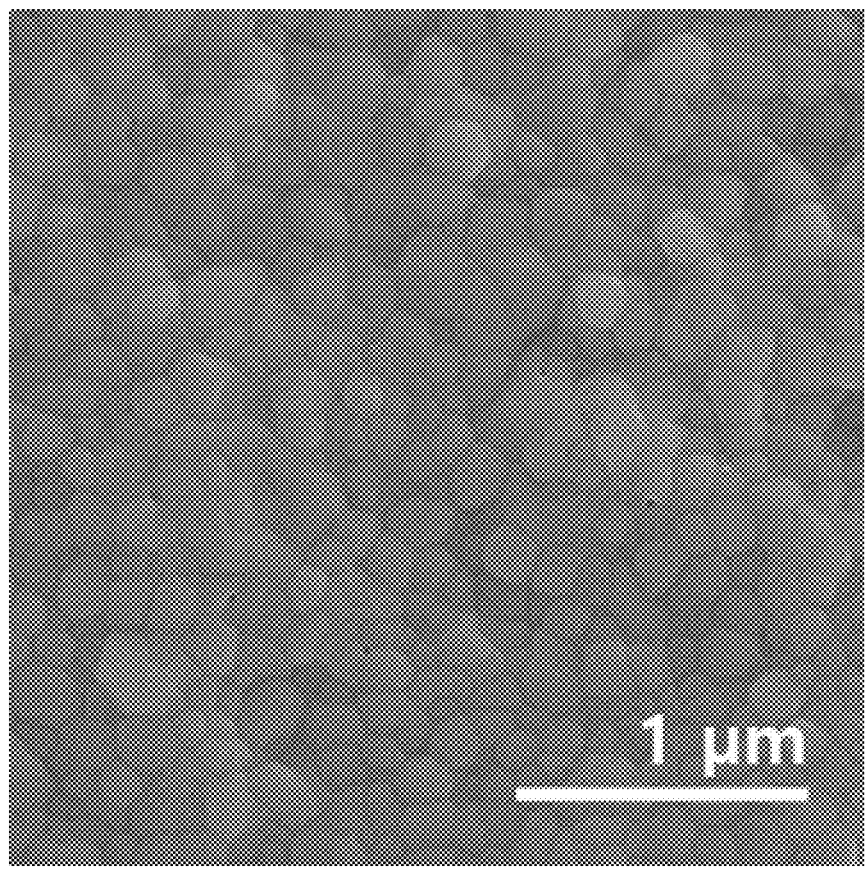

[FIG. 3B]
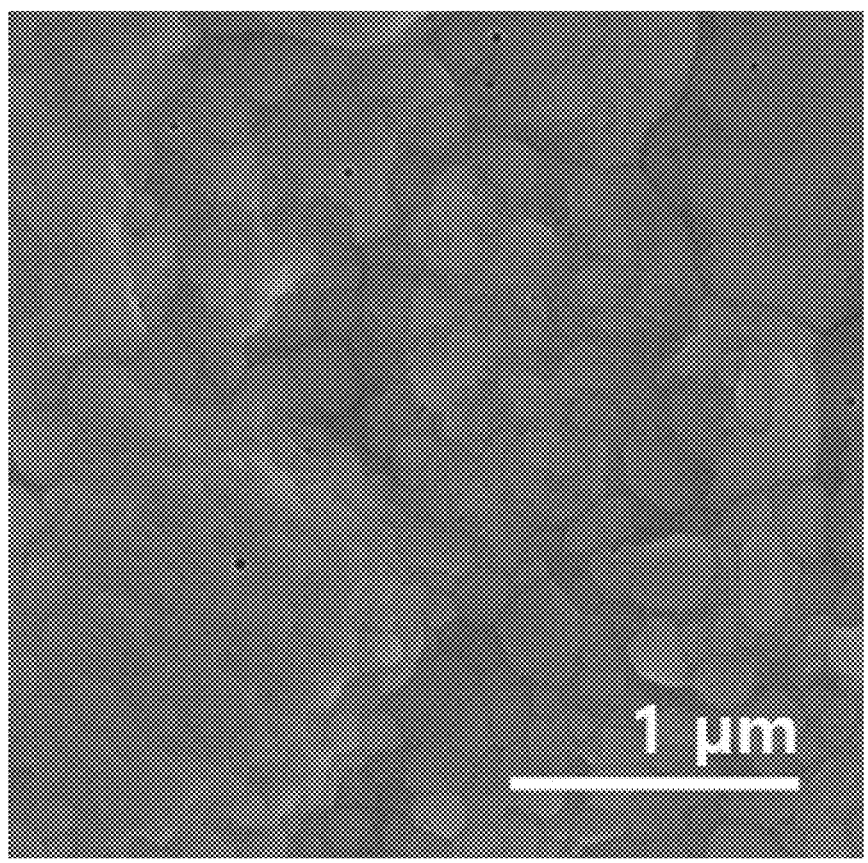

[FIG. 3C]
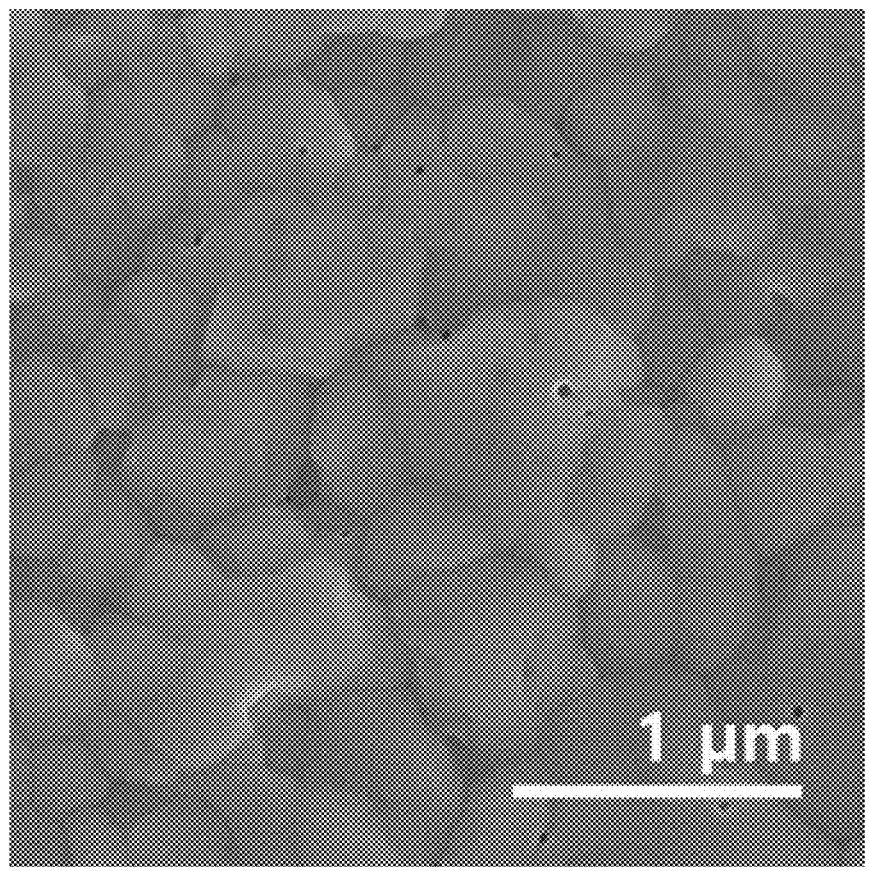

[FIG. 3D]
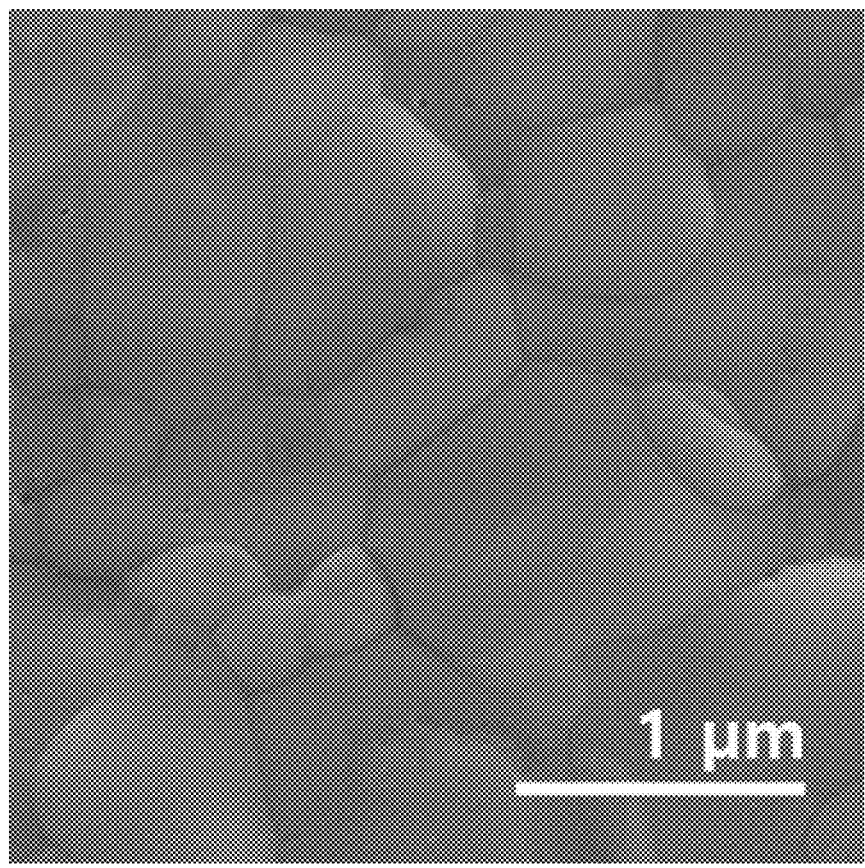

[FIG. 4A]
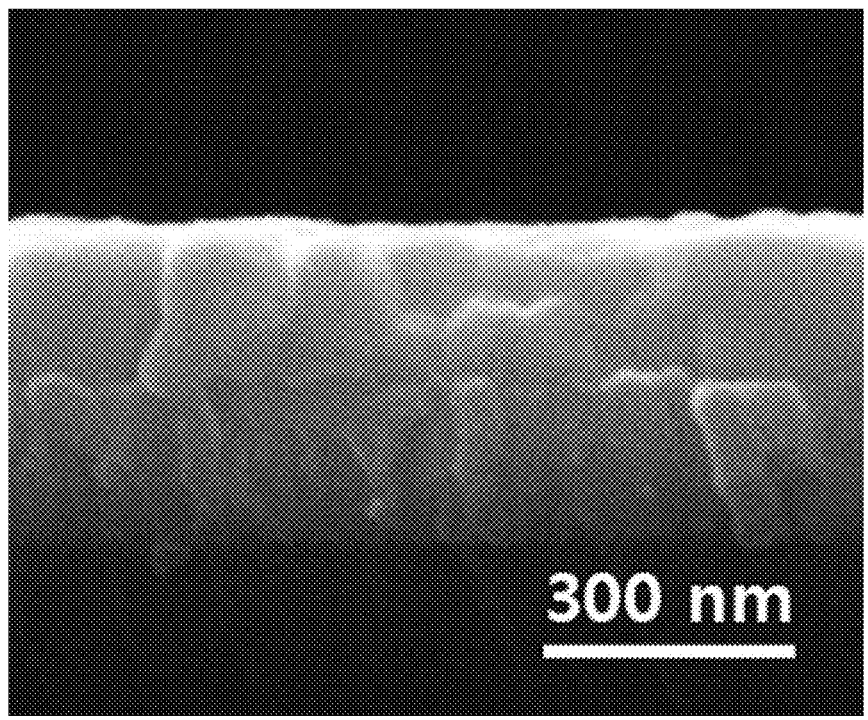

[FIG. 4B]
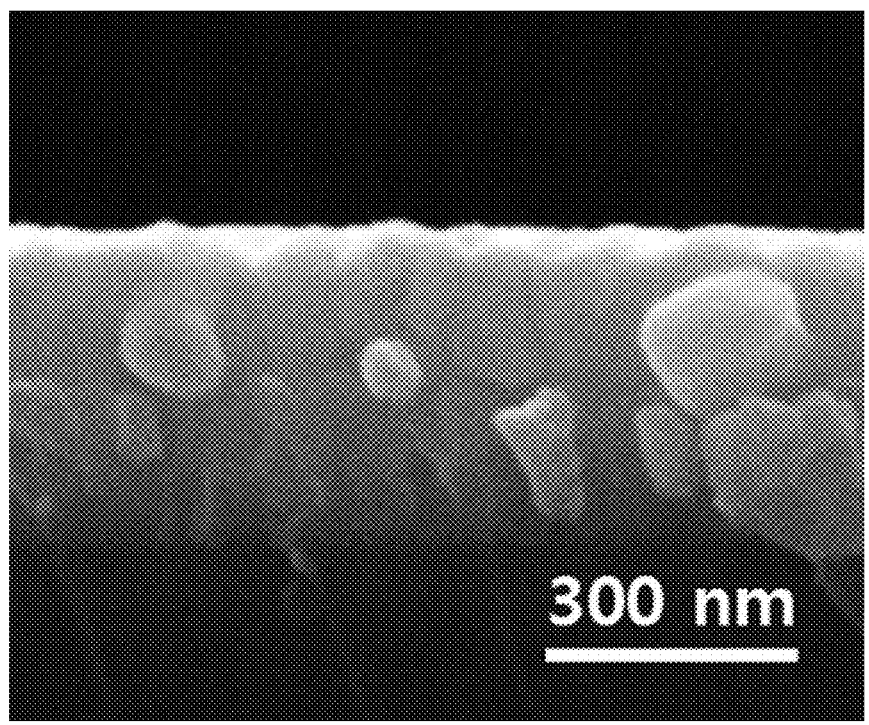

[FIG. 4C]
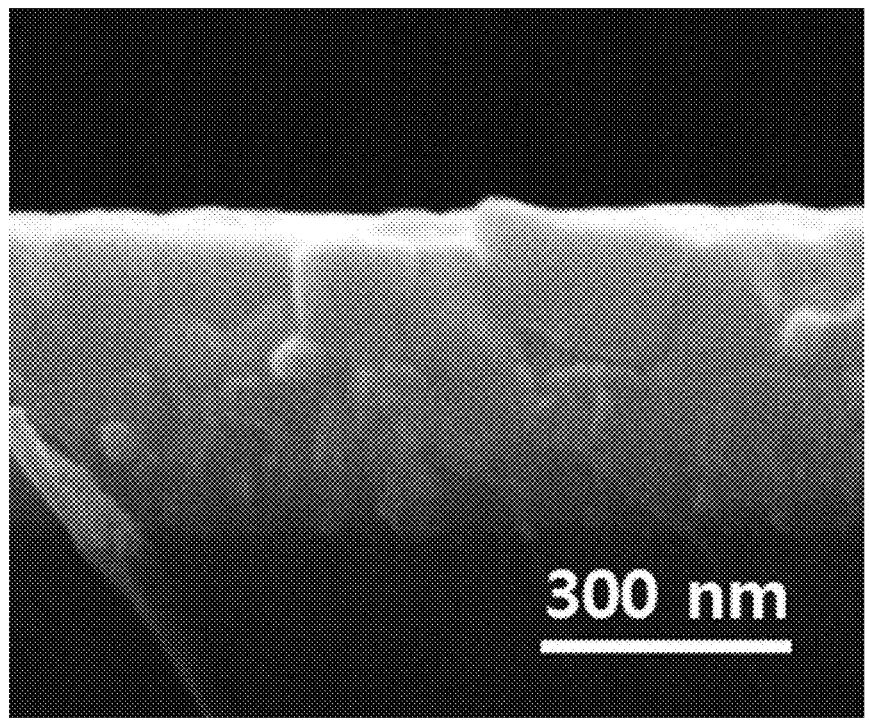

[FIG. 4D]
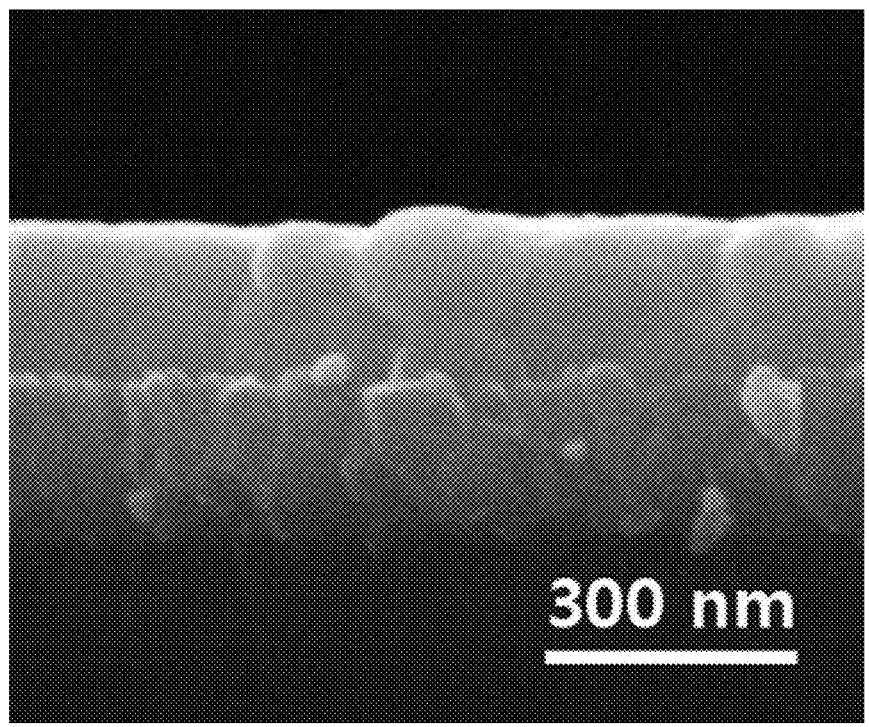

[FIG. 5A]
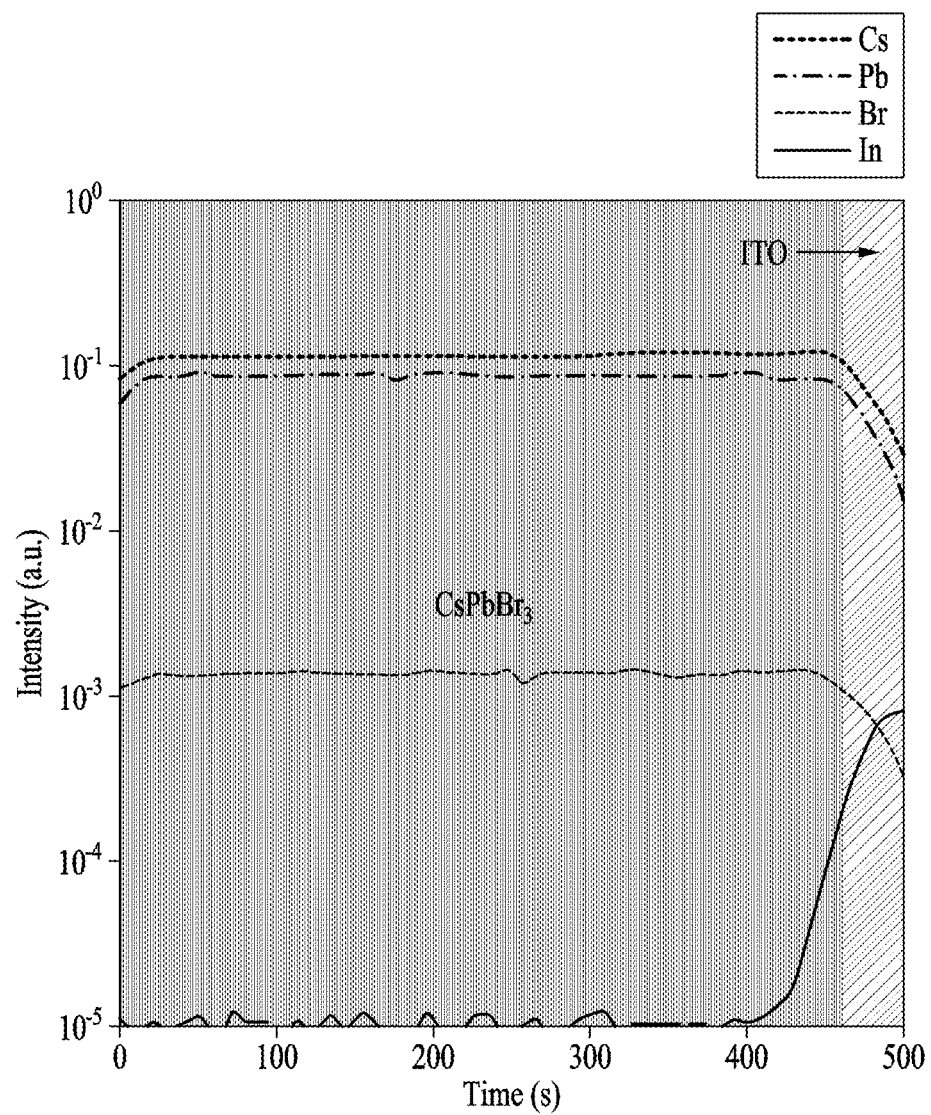

[FIG. 5B]
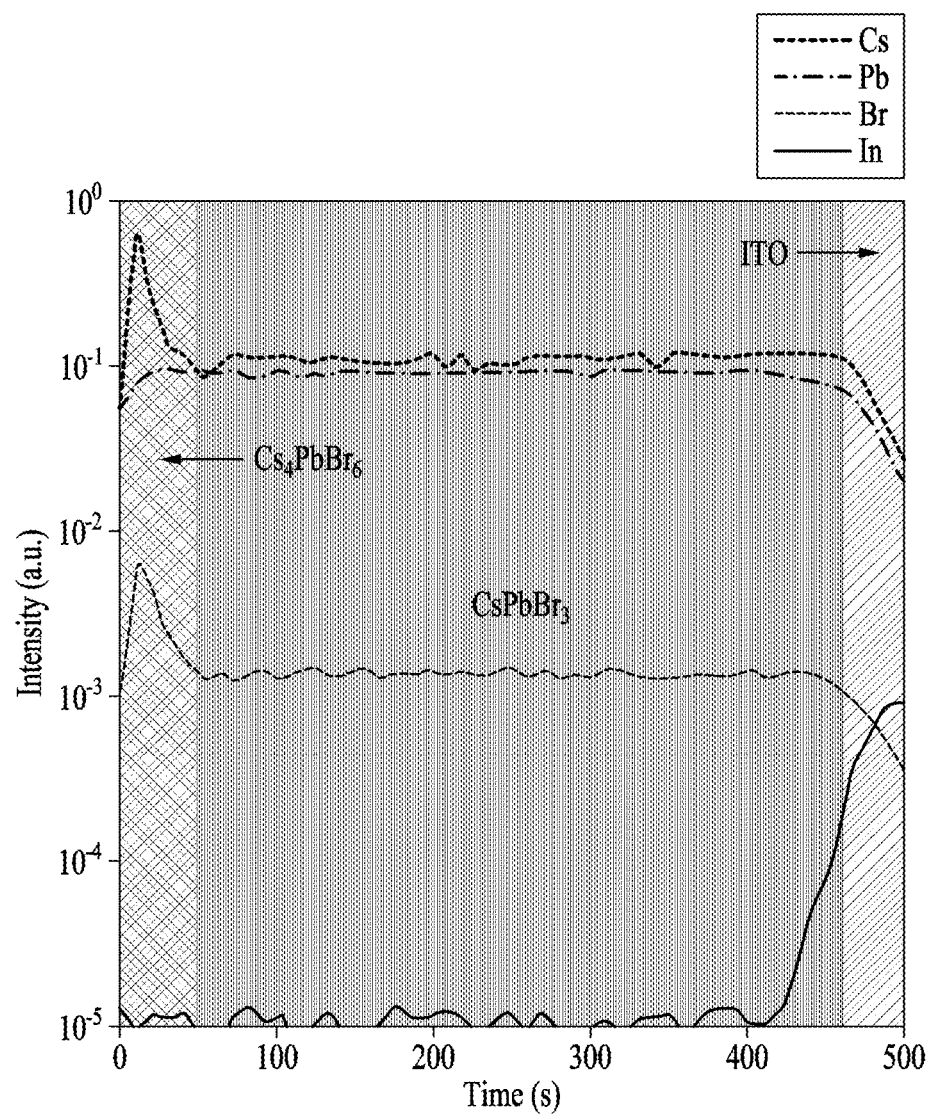

[FIG. 5C]
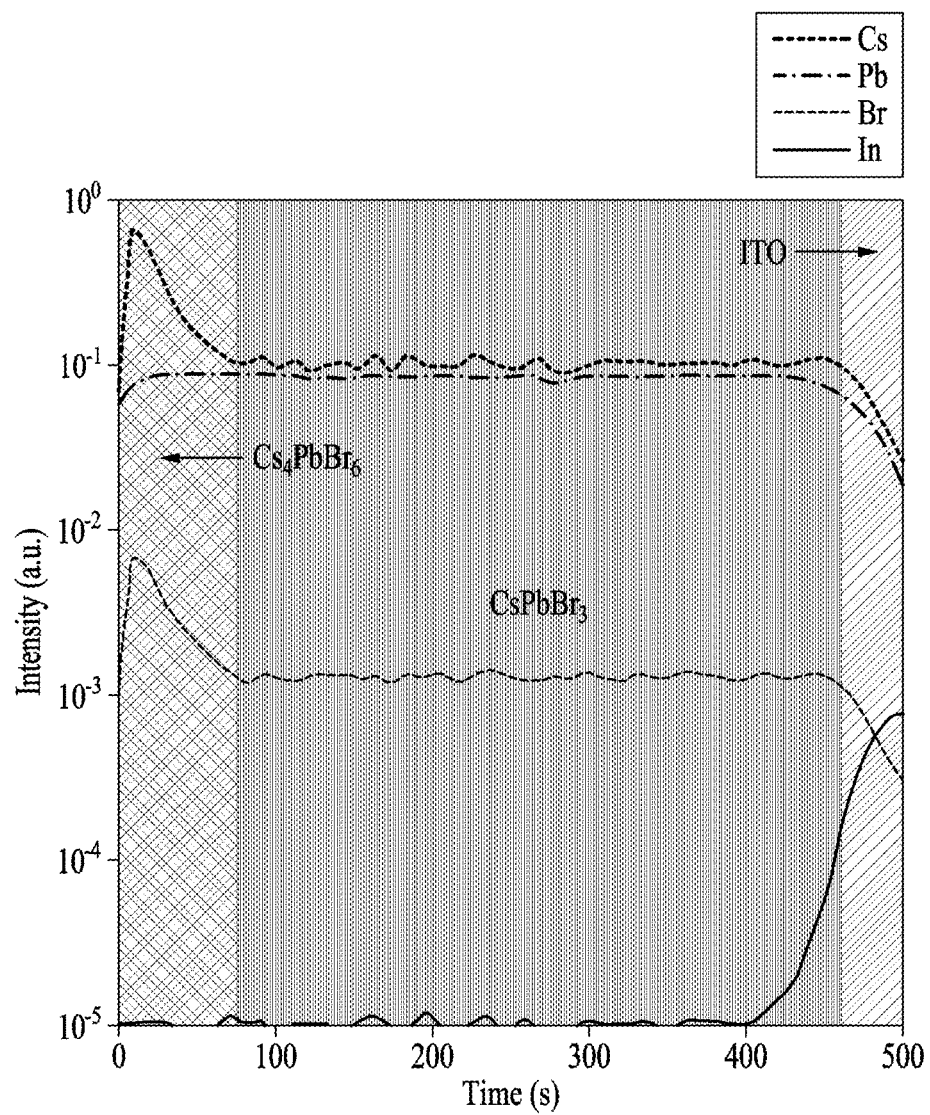

[FIG. 5D]
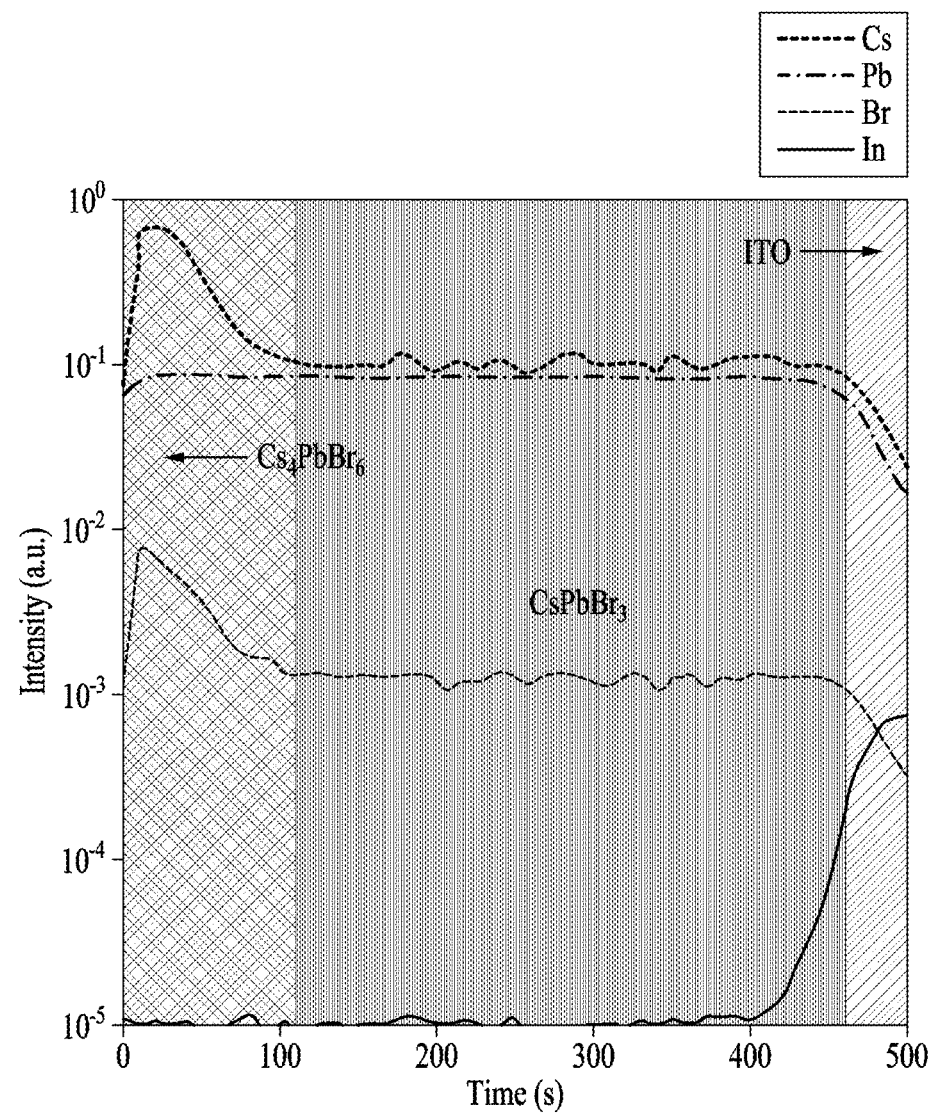

[ FIG. 6 ]
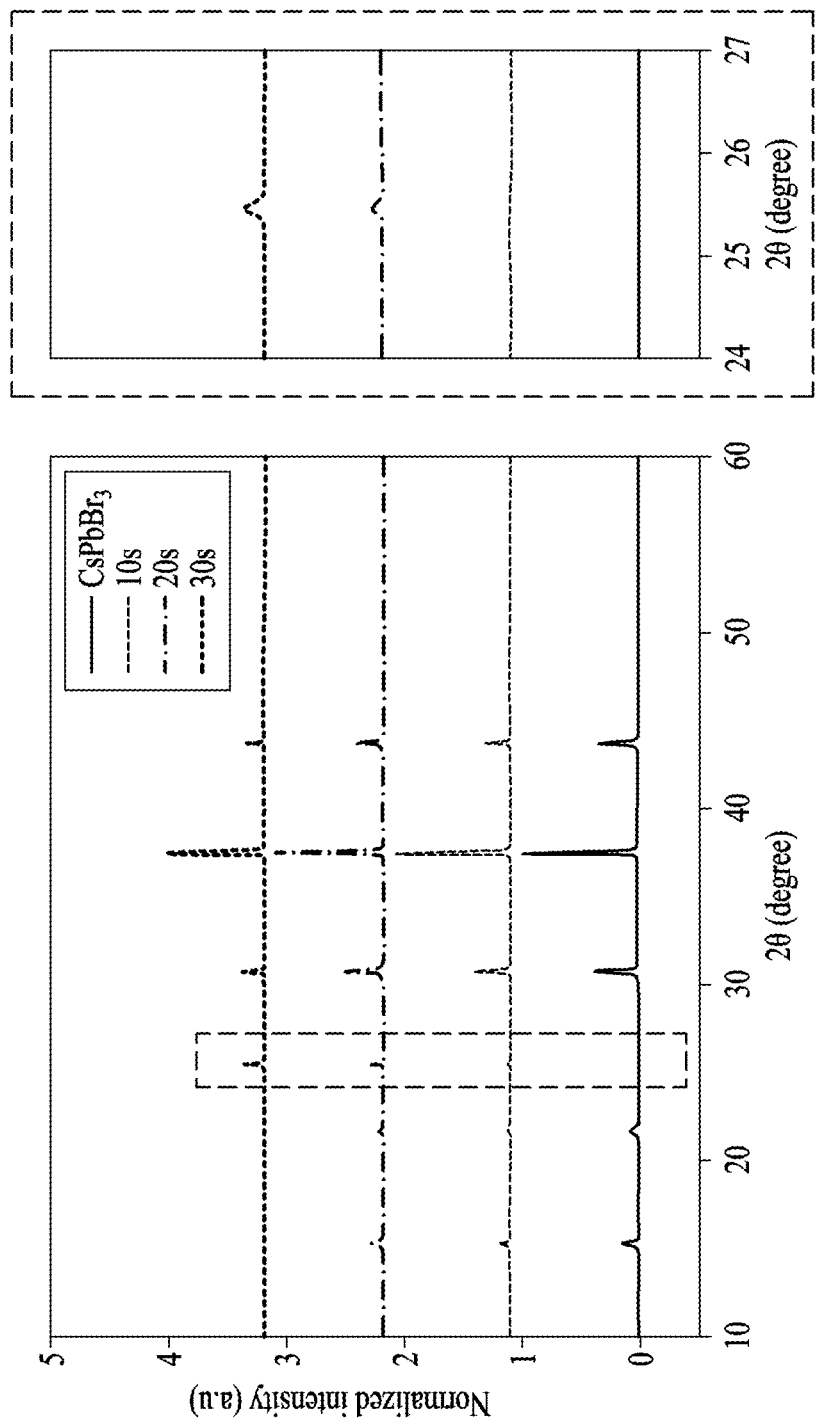

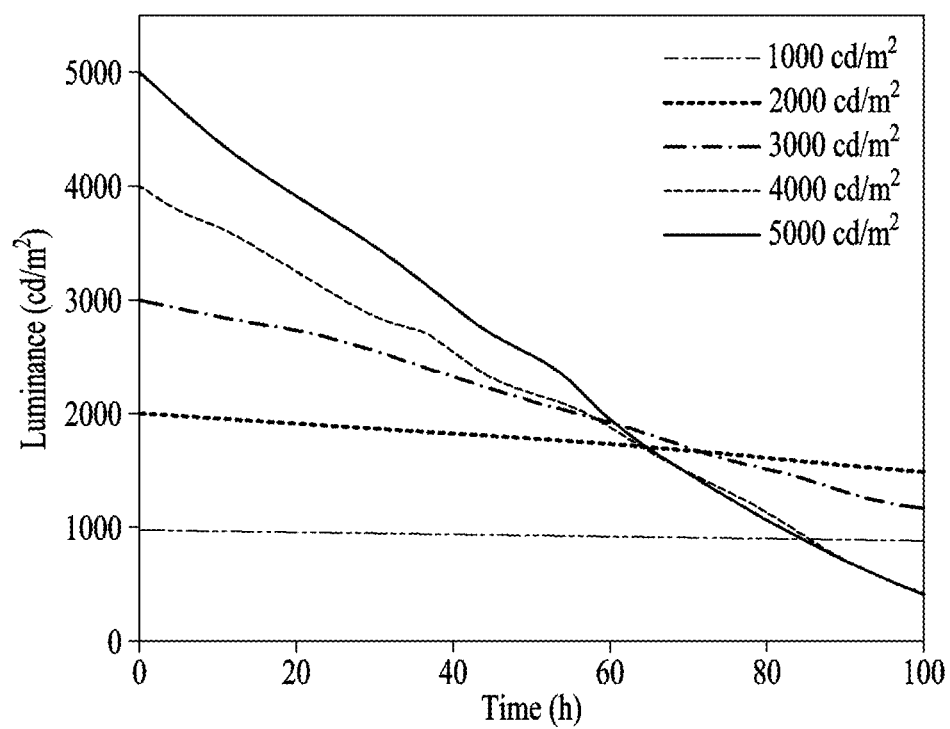
[FIG. 7A]

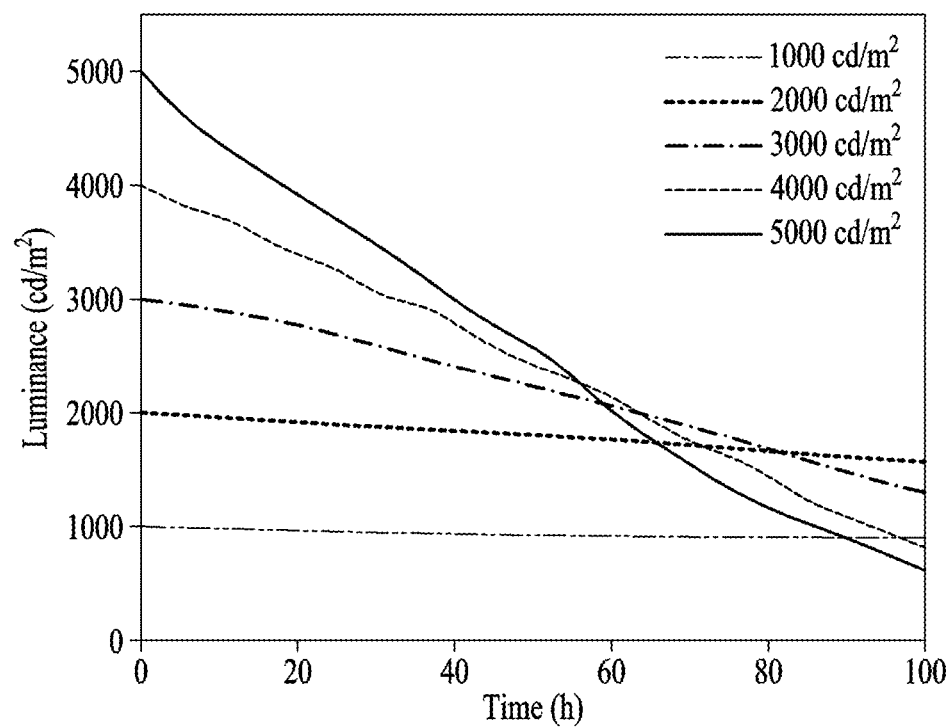
[FIG. 7B]

[FIG. 8A]
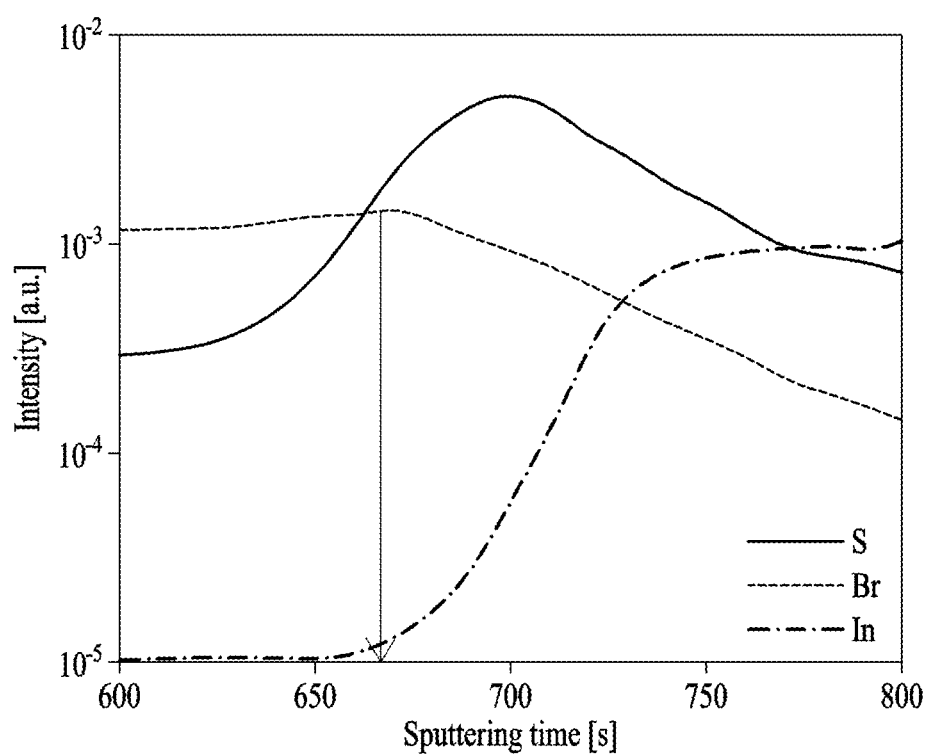

[FIG. 8B]
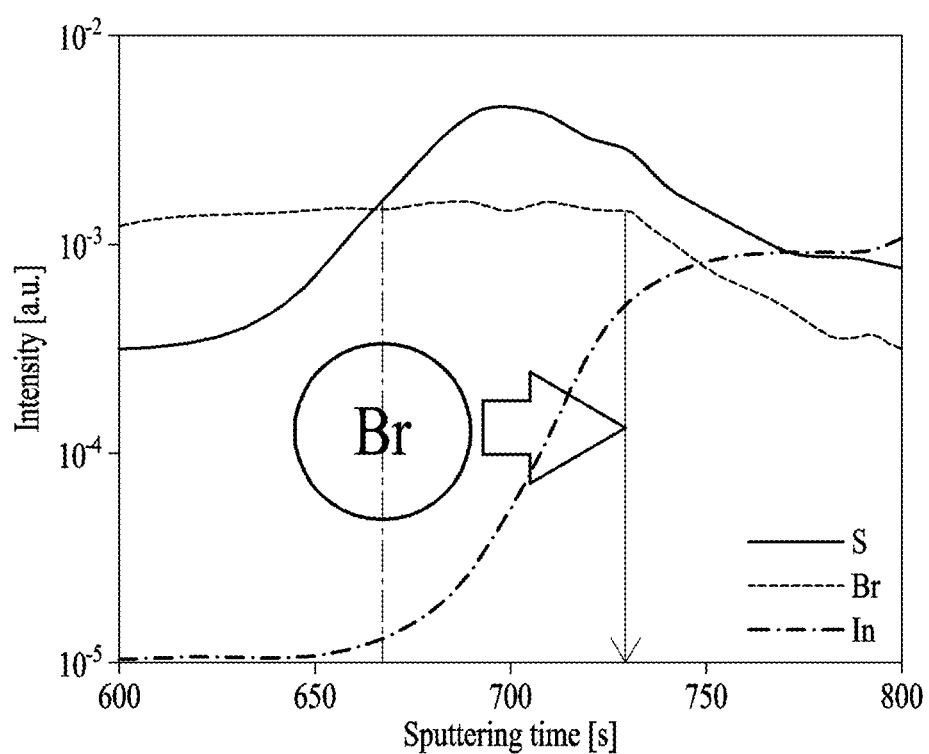

[FIG. 9A]
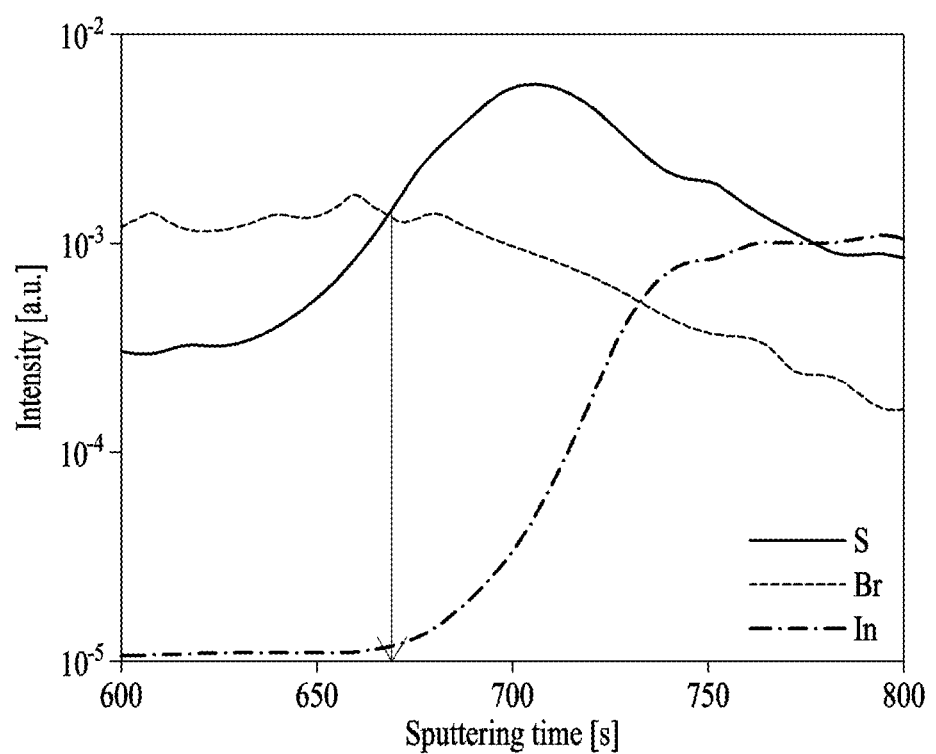

[FIG. 9B]
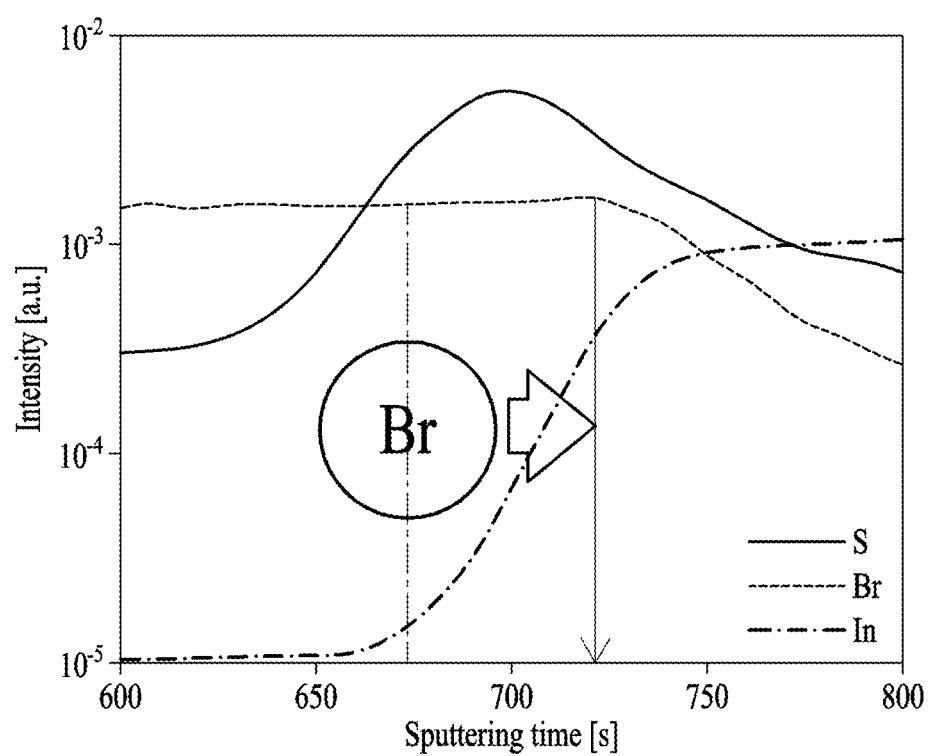

PEROVSKITE PHOTOELECTRIC DEVICE AND MANUFACTURING METHOD THEREOF

CROSS REFERENCE TO RELATED APPLICATIONS

This application is a U.S. National Stage Application of International Application No. PCT/KR2020/010471 filed on Aug. 7, 2020, which claims the benefit under 35 USC 119 (a) and 365(b) of Korean Patent Application No. 10-2019-0096837 filed on Aug. 8, 2019 in the Korean Intellectual Property Office, the disclosure of which is incorporated herein by reference.

TECHNICAL FIELD

The present invention relates a perovskite photoelectric device and a method of fabricating the same.

BACKGROUND ART

A perovskite solar cell uses $AMX_3$ (A is a cation, M is a metal cation, X is an anion)-type cubic diatom perovskite material with good electrical properties as a photoactive layer.

A perovskite solar cell can be manufactured more easily and inexpensively than a silicon solar cell, and a perovskite solar cell with the world's highest light conversion efficiency (22.7%) close to that of a silicon solar cell (about 25%) has been developed.

However, an existing perovskite light emitting device has a problem in that the light conversion efficiency of a battery rapidly decreases when used for more than 1000 hours.

This was found to be due to iodine ions, which constitute a photoactive layer of a perovskite light-emitting device, accumulated at an interface under an electrode (team led by Professor Changhee Lee of Electrical and Computer Engineering Department in Seoul National University).

To solve this durability problem, research into high-durability PLEDs is underway. However, it is very difficult to develop such PLEDs.

DISCLOSURE

Technical Problem

Therefore, the present invention has been made in view of the above problems, and it is one object of the present invention to provide a perovskite photoelectric device including a hole transport layer, a perovskite layer and a graded wall formed between the hole transport layer and the perovskite layer; and a method of fabricating the perovskite photoelectric device, so that movement of anions in the perovskite layer to other layers can be prevented, and thus, the light emitting lifespan of the perovskite photoelectric device can be improved.

It is another object of the present invention to provide a perovskite photoelectric device including a hole transport layer, a perovskite layer and a graded wall formed between the hole transport layer and the perovskite layer, wherein an anion concentration at the graded wall is higher than that at the perovskite layer; and a method of fabricating the perovskite photoelectric device, so that the movement of anions of the perovskite compound can be suppressed and thus the durability of the perovskite photoelectric device can be improved.

It is another object of the present invention to provide a perovskite photoelectric device including a hole transport layer, a perovskite layer and a graded wall formed between the hole transport layer and the perovskite layer; and a method of fabricating the perovskite photoelectric device, wherein the graded wall has voids smaller than the size of anions included in the perovskite layer, so that the movement of anions of the perovskite compound can be suppressed, and thus, the durability of the perovskite photoelectric device can be improved.

It is yet another object of the present invention to provide a perovskite photoelectric device having longer light emitting lifespan than an existing perovskite photoelectric device at the same luminance and thus having improved durability; and a method of fabricating the perovskite photoelectric device.

Technical Solution

In accordance with an aspect of the present invention, the above and other objects can be accomplished by the provision of a perovskite photoelectric device, including: a first electrode; a hole transport layer formed on the first electrode; a perovskite layer formed on the hole transport layer and made of a first perovskite compound; an electron transport layer formed on the perovskite layer; a second electrode formed on the electron transport layer; and a graded wall formed on the hole transport layer and the perovskite layer and made of a second perovskite compound, wherein the first perovskite compound and the second perovskite compound are represented by Formula 1 below, and the graded wall suppresses movement of anions included in the perovskite layer:

$$A_aM_bX_c \qquad \text{[Formula 1]}$$

where A is a monovalent cation, M is a divalent or trivalent metal cation, X is a monovalent anion, a+2b=c when M is a divalent metal cation, a+3B=c when M is a trivalent metal cation, and a, b and c are natural numbers.

In accordance with the perovskite photoelectric device according to an embodiment of the present invention, an anion concentration at the graded wall may be higher than an anion concentration at the perovskite layer so that movement of anions included in the perovskite layer is suppressed.

In accordance with the perovskite photoelectric device according to an embodiment of the present invention, a size of voids of the graded wall may be smaller than a size of anions included in the perovskite layer so that movement of anions included in the perovskite layer is suppressed.

In accordance with the perovskite photoelectric device according to an embodiment of the present invention, the graded wall may further include at least one of inorganic thin films including a metal chalcogen compound, a metal oxide, a metal halide, and a metal thin film and organic thin films including a graphene thin film, a polymer thin film, a crosslinked polymer thin film, and a monomolecular thin film.

In accordance with the perovskite photoelectric device according to an embodiment of the present invention, the graded wall may have a thickness of 0.5 nm to 100 μm.

In accordance with the perovskite photoelectric device according to an embodiment of the present invention, the perovskite photoelectric device may have a light emitting lifespan ($T_{90}$, at 100 cd/m²) of 2,000 hours to 200,000,000 hours.

In accordance with another aspect of the present invention, there is provided a method of fabricating a perovskite photoelectric device, the method including: forming a first electrode on a substrate; forming a hole transport layer on the first electrode; forming a graded wall made of a second perovskite compound on the hole transport layer; forming a perovskite layer made of a first perovskite compound on the graded wall; forming an electron transport layer on the perovskite layer; and forming a second electrode on the electron transport layer, wherein the first perovskite compound and the second perovskite compound are represented by Formula 1 below, and the graded wall suppresses movement of anions included in the perovskite layer:

[Formula 1]

where A is a monovalent cation, M is a divalent or trivalent metal cation, X is a monovalent anion, a+2b=c when M is a divalent metal cation, a+3B=c when M is a trivalent metal cation, and a, b and c are natural numbers.

In accordance with the method of fabricating a perovskite photoelectric device according to an embodiment of the present invention, the graded wall may be formed by spray-coating the second perovskite compound on the hole transport layer.

In accordance with the method of fabricating a perovskite photoelectric device according to an embodiment of the present invention, the spray coating may be performed for 0.1 seconds to 100,000 seconds.

In accordance with the method of fabricating a perovskite photoelectric device according to an embodiment of the present invention, a thickness of the graded wall may be adjusted according to a time for which the spray coating is performed.

In accordance with the method of fabricating a perovskite photoelectric device according to an embodiment of the present invention, the graded wall may have a thickness of 0.5 nm to 100 μm.

Advantageous Effects

According to an embodiment of the present invention, the movement of anions in a perovskite layer to other layers can be prevented by forming a graded wall between a hole transport layer and the perovskite layer, so that the light emitting lifespan of a perovskite photoelectric device can be improved.

According to an embodiment of the present invention, the movement of anions of the perovskite compound can be suppressed by forming a graded wall between a hole transport layer and a perovskite layer, wherein an anion concentration at the graded wall is higher than that at the perovskite layer, so that the durability of the perovskite photoelectric device can be improved.

According to an embodiment of the present invention, the movement of anions of the perovskite compound can be suppressed by forming a graded wall with voids between a hole transport layer and a perovskite layer, wherein the voids are smaller than the size of anions included in the perovskite layer, so that the durability of the perovskite photoelectric device can be improved.

According to an embodiment of the present invention, the perovskite photoelectric device has longer light emitting lifespan than an existing perovskite photoelectric device at the same luminance, thus having improved durability.

DESCRIPTION OF DRAWINGS

FIG. 1 is a sectional view illustrating the structure of a perovskite photoelectric device according to an embodiment of the present invention.

FIG. 2 is a flowchart illustrating a method of fabricating a perovskite photoelectric device according to an embodiment of the present invention.

FIG. 3A illustrates a scanning electron microscope (SEM) image, photographed in a plan view, of a perovskite photoelectric device according to a comparative example of the present invention.

FIG. 3B illustrates an SEM image, photographed in a plan view, of a perovskite photoelectric device including a graded wall formed thereon according to Example 1 of the present invention.

FIG. 3C illustrates an SEM image, photographed in a plan view, of a perovskite photoelectric device including a graded wall formed thereon according to Example 2 of the present invention.

FIG. 3D illustrates an SEM image, photographed in a plan view, of a perovskite photoelectric device including a graded wall formed thereon according to Example 3 of the present invention.

FIG. 4A illustrates an SEM image of a cross-section of a perovskite photoelectric device according to the comparative example of the present invention.

FIG. 4B illustrates an SEM image of a cross-section of a perovskite photoelectric device including a graded wall formed thereon according to Example 1 of the present invention.

FIG. 4C illustrates an SEM image of a cross-section of a perovskite photoelectric device including a graded wall formed thereon according to Example 2 of the present invention.

FIG. 4D illustrates an SEM image of a cross-section of a perovskite photoelectric device including a graded wall formed thereon according to Example 3 of the present invention.

FIG. 5A is a time-of-flight secondary ion mass spectroscope (TOF-SIMS) graph illustrating a compositional depth profile of a perovskite photoelectric device according to the comparative example of the present invention.

FIG. 5B is a TOF-SIMS graph illustrating a compositional depth profile of a perovskite photoelectric device including a graded wall formed thereon according to Example 1 of the present invention.

FIG. 5C is a TOF-SIMS graph illustrating a compositional depth profile of a perovskite photoelectric device including a graded wall formed thereon according to Example 2 of the present invention.

FIG. 5D is a TOF-SIMS graph illustrating a compositional depth profile of a perovskite photoelectric device including a graded wall formed thereon according to Example 3 of the present invention.

FIG. 6 illustrates the XRD patterns of perovskite photoelectric devices according to examples of the present invention and a comparative example.

FIG. 7A illustrates a time dependent-luminance change of a perovskite photoelectric device according to a comparative example of the present invention.

FIG. 7B illustrates a time dependent-luminance change of a perovskite photoelectric device according to Example 2 of the present invention.

FIG. 8A is a TOF-SIMS graph illustrating a compositional depth profile according to a sputtering time for an initial state (t=0 h) of a perovskite photoelectric device according to a comparative example of the present invention.

FIG. 8B is a TOF-SIMS graph illustrating a compositional depth profile according to a sputtering time for a final state (t=100 h) of the perovskite photoelectric device according to the comparative example of the present invention.

FIG. 9A is a TOF-SIMS graph illustrating a compositional depth profile according to a sputtering time for an initial state (t=0 h) of a perovskite photoelectric device according to Example 2 of the present invention.

FIG. 9B is a TOF-SIMS graph illustrating a compositional depth profile according to a sputtering time for a final state (t=100 h) of the perovskite photoelectric device according to Example 2 of the present invention.

BEST MODE

The present invention will now be described more fully with reference to the accompanying drawings and contents disclosed in the drawings. However, the present invention should not be construed as limited to the exemplary embodiments described herein.

The terms used in the present specification are used to explain a specific exemplary embodiment and not to limit the present inventive concept. Thus, the expression of singularity in the present specification includes the expression of plurality unless clearly specified otherwise in context.

It will be further understood that the terms "comprise" and/or "comprising", when used in this specification, specify the presence of stated steps, but do not preclude the presence or addition of one or more other steps thereof.

It should not be understood that arbitrary aspects or designs disclosed in "embodiments", "examples", "aspects", etc. used in the specification are more satisfactory or advantageous than other aspects or designs.

In addition, the expression "or" means "inclusive or" rather than "exclusive or". That is, unless otherwise mentioned or clearly inferred from context, the expression "x uses a or b" means any one of natural inclusive permutations.

In addition, as used in the description of the invention and the appended claims, the singular forms "a", "an" and "the" are intended to include the plural forms as well, unless context clearly indicates otherwise.

Although terms used in the specification are selected from terms generally used in related technical fields, other terms may be used according to technical development and/or due to change, practices, priorities of technicians, etc. Therefore, it should not be understood that terms used below limit the technical spirit of the present invention, and it should be understood that the terms are exemplified to describe embodiments of the present invention.

Also, some of the terms used herein may be arbitrarily chosen by the present applicant. In this case, these terms are defined in detail below. Accordingly, the specific terms used herein should be understood based on the unique meanings thereof and the whole context of the present invention.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present invention, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

FIG. 1 is a sectional view illustrating the structure of a perovskite photoelectric device according to an embodiment of the present invention.

Referring to FIG. 1, a perovskite photoelectric device 100 according to an embodiment of the present invention includes a substrate (not shown), a first electrode 110, a hole transport layer 120 formed on the first electrode 110, a perovskite layer 140 formed on the hole transport layer 120 and made of a first perovskite compound, an electron transport layer 150 formed on the perovskite layer 140, a second electrode 160 formed on the electron transport layer 150, and a graded wall 130 formed between the hole transport layer 120 and the perovskite layer 140 and made of a second perovskite compound.

As the substrate, an inorganic material substrate or an organic material substrate may be used.

The inorganic material substrate may be made of, without being limited to glass, quartz, $Al_2O_3$, SiC, Si, GaAs or InP.

The organic material substrate may be selected from, without being limited to, Kepton foil, polyimide (PI), polyethersulfone (PES), polyacrylate (PAR), polyetherimide (PEI), polyethylene naphthalate (PEN), polyethylene terephthalate (PET), polyphenylene sulfide (PPS), polyarylate, polycarbonate (PC), cellulose triacetate (CTA) and cellulose acetate propionate (CAP).

The inorganic material substrate and the organic material substrate are more preferably made of a transparent material through which light is transmitted, and any substrate that can be placed on a front electrode may be used. When an organic material substrate is applied, the flexibility of an electrode may be improved.

The first electrode 110 is preferably a conductive electrode placed on a substrate and, particularly, a transparent conductive electrode being capable of improving light transmission. For example, the first electrode 110 may be a front electrode provided on a light-receiving side an electrode.

For example, the first electrode 110 may be selected from, without being limited to, the group consisting of fluorine doped tin oxide (FTO), indium doped tin oxide (ITO), Al-doped zinc oxide (AZO), indium doped zinc oxide (IZO) or a mixture thereof.

Preferably, the first electrode 110 may include ITO, as a transparent electrode with a large work function, so as to facilitate injection of holes into a highest occupied molecular orbital (HOMO) level of the perovskite layer 140.

The first electrode 110 may be formed on the substrate by thermal evaporation, e-beam evaporation, radio frequency (RF) sputtering, magnetron sputtering, vacuum deposition, chemical vapor deposition, or the like.

In addition, the first electrode 110 may include a transparent conductive electrode having an OMO (O=organic material or metal oxide, M=metal) structure.

According to an embodiment, the first electrode 110 may have a sheet resistance of 1 $\Omega/cm^2$ to 1000 $\Omega/cm^2$ and a transmittance of 80% to 99.9%.

When the sheet resistance of the first electrode 110 is less than 1 $\Omega/cm^2$, the transmittance is decreased, and thus, it is difficult to use as a transparent electrode. When the sheet resistance of the first electrode 110 is greater than 1000 $\Omega/cm^2$, the performance of an element is decreased due to the high sheet resistance.

In addition, when the transmittance of the first electrode 110 is less than 80%, light extraction or light transmission is low, and thus, the performance of an element is decreased. When the transmittance of the first electrode 110 is greater than 99.9%, the performance of an element is decreased due to the high sheet resistance.

As shown in FIG. 1*a*, the hole transport layer 120 may be disposed between the first electrode 110 and the perovskite layer 140.

According to an embodiment, the hole transport layer 120 may be disposed between the first electrode 110 and the graded wall 130, as shown in FIG. 1*b*.

According to an embodiment, the hole transport layer 120 may serve to move holes injected from the first electrode 110 to the perovskite layer 140 when the perovskite photoelectric device 100 according to an embodiment of the present invention is used as a light emitting device, and may allow holes generated in the perovskite layer 140 to be easily transferred to the first electrode 110 when the perovskite photoelectric device 100 according to an embodiment of the present invention is used a solar cell.

The hole transport layer 120 may be at least one selected from, without being limited to, P3HT (poly[3-hexylthiophene]), MDMO-PPV (poly[2-methoxy-5-(3',7'-dimethyloctyloxyl)]-1,4-phenylene vinylene), MEH-PPV (poly[2-methoxy-5-(2"-ethylhexyloxy)-p-phenylene vinylene]), P3OT (poly(3-octyl thiophene)), POT (poly(octyl thiophene)), P3DT (poly(3-decyl thiophene)), P3DDT (poly(3-dodecyl thiophene), PPV (poly(p-phenylene vinylene)), TFB (poly(9,9'-dioctylfluorene-co-N-(4-butylphenyl)diphenylamine), Polyaniline, Spiro-MeOTAD ([2,22',7,77'-tetrkis (N,N-dipmethoxyphenylamine)-9,9,9'-spirobi fluorine]), CuSCN, CuI, $MoO_x$, $VO_x$, $NiO_x$, $CuO_x$, PCPDTBT (Poly [2,1,3-benzothiadiazole-4,7-diyl[4,4-bis(2-ethylhexyl-4H-cyclopenta [2,1-b:3,4-b']dithiophene-2,6-diyl]], Si-PCPDTBT (poly[(4,4'-bis(2-ethylhexyl)dithieno[3,2-b: 2',3'-d]silole)-2,6-diyl-alt-(2,1,3-benzothiadiazole)-4,7-diyl]), PBDTTPD (poly((4,8-diethylhexyloxyl)benzo([1,2-b:4,5-b']dithiophene)-2,6-diyl)-alt-((5-octylthieno[3,4-c] pyrrole-4,6-dione)-1,3-diyl)), PFDTBT (poly[2,7-(9-(2-ethylhexyl)-9-hexyl-fluorene)-alt-5,5-(4',7-di-2-thienyl-2', 1',3'-benzothiadiazole)]), PFO-DBT (poly[2,7-9,9-(dioctyl-fluorene)-alt-5,5-(4',7'-di-2-thienyl-2',1',3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT (poly[(4,4'-bis(2-ethylhexyl)dithieno[3,2-b:2',3'-d]silole)-2,6-diyl-alt-(2,1,3-benzothiadiazole)-4,7-diyl]), PCDTBT (Poly[[9-(1-octylnonyl)-9H-carbazole-2,7-diyl]-2,5-thiophenediyl-2,1, 3-benzothiadiazole-4,7-diyl-2,5-thiophenediyl]), PFB (poly (9,9'-dioctylfluorene-co-bis(N,N'-(4,butylphenyl))bis(N,N'-phenyl-1,4-phenylene)diamine), F8BT (poly(9,9'-dioctylfluorene-cobenzothiadiazole), PEDOT (poly(3,4-ethylenedioxythiophene)), PEDOT:PSS, poly(3,4-ethylenedioxythiophene) poly (styrenesulfonate), PTAA (poly(triarylamine)), poly(4-butylphenyldiphenyl-amine), 4,4'-bis[N-(1-naphtyl)-N-phenylamino]-biphenyl (NPD), PEDOT:PSSbis(N-(1-naphthyl-n-phenyl))benzidine (α-NPD) mixed with PFI (perfluorinated ionomer), N,N'-di (naphthalen-1-yl)-N,N'-diphenyl-benzidine (NPB), N,N'-diphenyl-N,N'-bis(3-methylphenyl)-1,1'-diphenyl-4,4'-di-amine (TPD), copper phthalocyanine (CuPc), 4,4',4"-tris(3-methylphenylamino)triphenylamine (m-MTDATA), 4,4',4"-tris(3-methylphenylamino)phenoxybenzene (m-MTDAPB), starburst-type amines  4,4',4"-tri (N-carbazolyl)triphenylamine (TCTA), 4,4',4"-tris(N-(2-naphthyl)-N-phenylamino)-triphenylamine (2-TNATA) and a copolymer thereof.

The perovskite layer 140 may be formed between the hole transport layer 120 and the electron transport layer 150.

The first perovskite compound forming the perovskite layer 140 may be represented by Formula 1 below:

$$A_aM_bX_c \quad \text{[Formula 1]}$$

where Formula 1, A is a monovalent cation, M is a divalent or trivalent metal cation, X is a monovalent anion, a+2b=c when M is a divalent metal cation, a+3B=c when M is a trivalent metal cation, and a, b and c are natural numbers.

Particularly, A may be a monovalent organic cation, a monovalent inorganic cation or a combination thereof.

The perovskite compound may an organic/inorganic hybrid perovskite compound or an inorganic metal halide perovskite compound, depending upon the type of A of Formula 1.

More particularly, when A in Formula 1 is a monovalent organic cation, the perovskite compound may be composed of an organic material A and inorganic materials M and X, and thus, may be an organic/inorganic hybrid perovskite compound composed of an organic material and an inorganic material.

On the other hand, when A in Formula 1 is a monovalent inorganic cation, the perovskite compound may be composed of inorganic materials A, M and X, and thus, may be an inorganic metal halide perovskite compound composed of only an inorganic material.

When the monovalent cation A is an organic cation, it may be a $C_{1-24}$ linear or branched alkyl group, an amine group ($-NH_3$), a hydroxyl group ($-OH$), a cyano group ($-CN$), a halogen group, a nitro group ($-NO$), a methoxy group ($-OCH_3$) or an imidazolium group-substituted $C_{1-24}$ linear or branched alkyl group or a combination thereof.

When the monovalent cation A is an inorganic cation, it may be $Li^+$, $Na^+$, $K^+$, $Rb^+$, $Cs^+$, $Fr^+$, $Cu(I)^+$, $Ag(I)^+$, $Au(I)^+$ or a combination thereof.

The divalent metal cation may include at least one of $Pb^{2+}$, $Sn^{2+}$, $Ge^{2+}$, $Cu^{2+}$, $Co^{2+}$, $Ni^{2+}$, $Ti^{2+}$, $Zr^{2+}$, $Hf^{2+}$, $Rf^{2+}$, $In^{3+}$, $Bi^{3+}$, $Co^{3+}$, $Sb^{3+}$ and $Ni^{3+}$.

According to an embodiment, when M of Formula 1 is a trivalent metal cation, it may be $In^{2+}$, $Bi^{3+}$, $Co^{3+}$, $Sb^{3+}$, $Ni^{3+}$, $Al^{3+}$, $Ga^{3+}$, $Tl^{3+}$, $Sc^{3+}$, $Y^{3+}$, $La^{3+}$, $Ce^{3+}$, $Fe^{3+}$, $Ru^{3+}$, $Cr^{3+}$, $V^{3+}$, $Ti^{3+}$ or a combination thereof.

Particularly, when M is the divalent metal cation, a+2b=c and, when M is a trivalent cation, a+3B=c.

X, which is a monovalent anion, may include $F^-$, $Cl^-$, $Br^-$, $I^-$, $BF_4^-$, $PF_6^-$ and $SCN^-$, and is not limited thereto unless the ion size is excessively large.

According to an embodiment, the first perovskite compound may have a single structure, a double structure, a triple structure, or a Ruddlesden-Popper structure.

A perovskite compound having a single structure corresponds to the perovskite of Formula 1 having a three-dimensional single phase, and a perovskite compound having a double structure corresponds to the perovskite layer 140 formed by alternately stacking $(A1)_a$ $(M1)_b$ $(X1)_c$ and $(A2)_a$ $(M2)_b$ $(X2)_c$.

Here, in Formulas $(A1)_a(M1)_b(X1)_c$ and $(A2)_a$ $(M2)_b$ $(X2)_c$, A1 and A2 are the same or different monovalent cations, M1 and M2 are the same or different divalent metal cations or trivalent metal cations, and X1 and X2 are the same or different monovalent anions. Here, at least one of A1, M1 and X1 differs from A2, M2 and X2.

The perovskite compound having a triple structure is a perovskite film formed by alternately stacking $(A1)_a$ $(M1)_b$ $(X1)_c$, $(A2)_a$ $(M2)_b(X2)_c$ and $(A3)_a$ $(M3)_b$ $(X3)_c$. Here, A1, A2 and A3 are the same or different monovalent cations, M1, M2 and M3 are the same or different divalent metal cations or trivalent metal cations, and X1, X2 and X3 are the same or different monovalent anions. Here, A1, M1 and X1, and A2, M2 and X2, and A3, M3 and X3 differ from each other by at least one.

The Ruddlesden-Popper structure is $(A1)_a (M1)_b (X1)_c \{(A2)_a (M2)_b (X2)_c\}_n (A1)_a (M1)_b (X1)_c$. Here, n is a natural number.

The electron transport layer 150 may be placed between the perovskite layer 140 and the second electrode 160.

When the perovskite photoelectric device 100 according to an embodiment of the present invention is used as a light emitting device, the electron transport layer 150 may move electrons injected from the second electrode 160 to the perovskite layer 140, and when the perovskite photoelectric device 100 according to an embodiment of the present invention is used as a solar cell, the electron transport layer 150 may allow electrons generated in the perovskite layer 140 to be easily transferred to the second electrode 160.

The electron transport layer 150 may include, without being limited to, at least one of fullerene (C60), a fullerene derivative, perylene, TPBi (2,2',2"-(1,3,5-benzenetriyl)-tris(1-phenyl-1-H-benzimidazole)), PBI (polybenzimidazole) and PTCBI (3,4,9,10-perylene-tetracarboxylic bis-benzimidazole), NDI (Naphthalene diimide) and a derivative thereof, $TiO_2$, $SnO_2$, ZnO, $ZnSnO_3$, 2,4,6-Tris(3-(pyrimidin-5-yl)phenyl)-1,3,5-triazine, 8-Hydroxyquinolinolato-lithium, 1,3,5-Tris(1-phenyl-1Hbenzimidazol-2-yl)benzene, 6,6'-Bis[5-(biphenyl-4-yl)-1,3,4-oxadiazo-2-yl]-2,2'-bipyridyl, 4,4'-Bis(4,6-diphenyl-1,3,5-triazin-2-yl)biphenyl (BTB), $Rb_2CO_3$ (Rubidium carbonate) and $ReO_3$ (Rhenium (VI) oxide), and the fullerene derivative may be, without being limited to, PCBM ((6,6)-phenyl-C61-butyric acid-methylester) or PCBCR ((6,6)-phenyl-C61-butyric acid cholesteryl ester).

However, in an inverted structure, the electron transport layer 150 may be mainly made of, without being limited to a $TiO_2$-based or $Al_2O_3$-based porous material.

The second electrode 160 may be a commonly used rear electrode. Particularly, the second electrode 160 may be, without being limited to, lithium fluoride/aluminum (LiF/Al), gold (Au), silver (Ag), platinum (Pt), palladium (Pd), copper (Cu), aluminum (Al), carbon (C), cobalt sulfide (CoS), copper sulfide (CuS), nickel oxide (NiO) or a mixture thereof. The second electrode 160 may also be formed by the method described regarding the first electrode 110, and thus, a redundant description thereof is omitted.

As the second electrode 160, a metal-based electrode having a low large work function to facilitate injection of electrons into the highest occupied molecular orbital (HOMO) level of the perovskite layer 140 and having excellent internal reflectance may be used.

The graded wall 130 may be formed between the hole transport layer 120 and the perovskite layer 140.

The second perovskite compound constituting the graded wall 130 is represented by Formula 1 and may inhibit the movement of anions included in the first perovskite compound constituting the perovskite layer 140.

According an existing perovskite light-emitting device, the anions included in the photoactive layer made of the perovskite compound move toward a positive electrode due to electrostatic properties thereof and are accumulated at the electrode interface.

As such, anions move toward an electrode (especially positive electrode) and move to the hole transport layer formed on the positive electrode, which causes the lifespan of the perovskite light-emitting device to decrease.

Accordingly, to prevent anions included in the perovskite layer 140 from moving to the hole transport layer 120, the graded wall 130 may be formed between the hole transport layer 120 and the perovskite layer 140.

According to an embodiment, since an anion concentration at the graded wall 130 is higher than that at the perovskite layer 140, movement of the anions included in the perovskite layer 140 to the hole transport layer 120 may be inhibited due to a difference in the anion concentrations.

Particularly, when the type of anions of the second perovskite compound is the same as that of the first perovskite compound and the number of anions of the second perovskite compound is larger than that of the first perovskite compound, the concentration of anions included in the perovskite layer 140 may be smaller than that included in the graded wall.

Due to such an anion concentration difference, anions included in in the perovskite layer1 140 are not moved to the hole transport layer 120 by the graded wall 130.

For example, when the first perovskite compound is $CsPbBr_3$ ($AMX_3$ structure as a mixture of AX and $MX_2$), the content of anions (X) in the second perovskite compound may increase because AX or $MX_2$ is further added to the first perovskite compound.

Particularly, when n=1 and $Cs_2PbBr_4$, n=3 in $CsPbBr_{3+n}$ $CsBr=Cs_{(1+n)}PbBr_{(3+n)}$, the second perovskite compound may be $Cs_4PbBr_6$, or the like.

Alternatively, the formula of the second perovskite compound may be obtained using $nCsPbBr_3 + mPbBr_2 = Cs_n Pb_{(n+m)} Br_{(3n+2m)}$ (where n=integer of 0 or more, and m an integer of 1 or more).

According to an embodiment, the graded wall 130 has voids smaller than the size of anions included in the perovskite layer 140, so that the movement of anions included in the perovskite layer 140 to the hole transport layer 120 may be suppressed.

That is, since the graded wall 130 has voids smaller than the size of anions included in the perovskite layer 140, anions included in the perovskite layer 140 do not pass through voids of the graded wall 130, so that movement of the anions to the hole transport layer 120 may be suppressed.

To have voids smaller than the size of anions included in the perovskite layer 140, the graded wall 130 may further include at least one of inorganic thin films including a metal chalcogen compound, a metal oxide, a metal halide, and a metal thin film and organic thin films including a graphene thin film, a polymer thin film, a crosslinked polymer thin film, and a monomolecular thin film.

According to an embodiment, at least one of the cation (A), metal cation (M), and anion (X) of the first perovskite compound may be the same as or different from at least one of the cation (A), metal cation (M), and anion (X) of the second perovskite compound.

For example, the first perovskite compound may be $CsPbBr_3$, and the second perovskite compound may be $Cs_4PbBr_6$, without being limited thereto.

The second perovskite compound has the same characteristics as those of the first perovskite compound except that the number of anions in the second perovskite compound is greater than that of the first perovskite compound, and thus, a redundant description thereof is omitted.

Accordingly, since in the case of the perovskite photoelectric device 100 according to an embodiment of the present invention, the graded wall 130 is formed between the hole transport layer 120 and the perovskite layer 140, movement of anions of the perovskite compound to the hole transport layer 120 may be suppressed, so that the light emitting lifespan of the perovskite photoelectric device 100 may be improved.

Hereinafter, a method of fabricating the perovskite photoelectric device 100 according to an embodiment of the present invention is described with reference to FIG. 2 and the perovskite photoelectric device 100 according to an embodiment of the present invention is also more particularly described.

FIG. 2 is a flowchart illustrating a method of fabricating a perovskite photoelectric device according to an embodiment of the present invention.

Referring to FIG. 2, the method of fabricating a perovskite photoelectric device according to an embodiment of the present invention may include a step S110 of forming a first electrode on a substrate, a step S120 of forming a hole transport layer on the first electrode, a step S130 of forming a graded wall using a second perovskite compound on the hole transport layer, a step S140 of forming a perovskite layer using a first perovskite compound on the graded wall, a step S150 of forming an electron transport layer on the perovskite layer, and a step S160 of forming a second electrode 160 on the electron transport layer.

In step S130, the graded wall may be formed by applying a solution including the second perovskite compound onto the hole transport layer.

According to an embodiment, steps S130 and S140 may be performed at the same time.

That is, after step S120, the perovskite layer on which the graded wall has been formed may be formed on the hole transport layer.

According to an embodiment, in step S130, the solution including the second perovskite compound may be coated on the hole transport layer by spray coating or ultrasonic spray coating, thereby forming the graded wall.

According to an embodiment, when steps S130 and S140 are performed at the same time, a solution including the first and second perovskite compounds may be coated on the hole transport layer by spray coating or ultrasonic spray coating.

According to an embodiment, the spray coating may be applied to any one point on the hole transport layer for 0.1 to 100,000 seconds.

The spray coating time is less than 0.1 seconds, it is difficult to a graded wall in the form of a thin film on the hole transport layer due to an insufficient amount of the second perovskite compound.

When the spray coating time exceeds 100,000 seconds, a graded wall is formed in the form of a very thick film, so that there is difficulty in applying to an LED or solar cell requiring a thin film.

When a large-area graded wall is formed using a spray coating, the spray coating may be performed while moving a spray nozzle at a speed of 0.001 m/min to 20 m/min.

When the spray nozzle is moved at a speed of less than 0.001 m/min, there is a disadvantage that a process speed is too low and, when the speed exceeds 20 m/min, it is difficult to obtain a uniform inclined wall without pinholes due to an excessively fast moving speed.

A discharge amount of the solution, which includes the second perovskite compound, discharged from a spray nozzle may be 0.001 ml/min to 1000 ml/min.

When the discharge amount is less than 0.001 ml/min, the amount of the solution including the second perovskite compound sprayed from the spray nozzle is small, so that all of the solution is blown off before reaching the substrate or the amount applied is small, and thus, a process time is long.

When the discharge amount exceeds 1000 ml/min, the solution is applied in an excessive amount, so that there is difficulty in drying, and thus, it is difficult to obtain a uniform film.

The thickness of the graded wall may be changed according to a spray coating time.

Particularly, the thickness of the graded wall is thin when the spray coating time is short, and the thickness of the graded wall is thick when the spray coating time is long.

According to an embodiment, the thickness of the graded wall may be 0.5 nm to 100,000 nm.

When the thickness is less than 0.5 nm, it is difficult to form the graded wall to a uniform thickness on the entire surface, and when the thickness exceeds 100,000 nm, there is difficulty in applying to a thin film-type LED and solar cell.

The graded wall formed on the hole transport layer may suppress the movement of anions included in the perovskite layer.

Particularly, since the anion concertation at the graded wall is higher than that at the perovskite layer, movement of anions included in the perovskite layer to the hole transport layer may be suppressed due to a difference in anion concentrations.

In other words, since the anion concentration at the second perovskite compound included in the graded wall is higher than the anion concentration at the first perovskite compound included in the perovskite layer, movement of anions included in the perovskite layer to the hole transport layer due to a difference in anion concentrations may be suppressed. A detailed description thereof has been described above with reference to FIG. 1, and thus, a redundant description thereof is omitted.

According to an embodiment, the graded wall has voids smaller than the size of anions included in the perovskite layer, so that movement of anions included in the perovskite layer to the hole transport layer may be suppressed. A detailed description thereof has been described above with reference to FIG. 1, and thus, a redundant description thereof is omitted.

Accordingly, the graded wall formed by the method of fabricating a perovskite photoelectric device according to an embodiment of the present invention suppress the movement of anions included in the perovskite layer to the hole transport layer, thereby being capable of improving the durability of the perovskite photoelectric device.

Accordingly, the perovskite photoelectric device fabricated by the method of fabricating a perovskite photoelectric device according to an embodiment of the present invention may have a light emitting lifespan ($T_{90}$, at 100 cd/m$^2$) of 2,000 hours to 200,000,000 hours.

Hereinafter, a perovskite photoelectric device according to the present invention was fabricated according the following fabrication example, and then the characteristics and effects of the perovskite photoelectric device were evaluated through the following comparative examples and examples.

Fabrication Example

1. Materials

Patterned ITO glass (tin oxide doped with indium, 12Ω) was purchased from HANALINTECH, and a cleaning solution (Micro-90) was purchased from CnP Science.

Cesium bromide (CsBr, 99.999%), lead bromide (PbBr$_2$, 99.999%), hydrobromic acid (HBr, 48% by weight), DMSO (dimethylsulfoxide, 99.7%), DMF (N,N-dimethylformamide, 99.8%), PFI (tetrafluoroethylene-perfluoro-3,6dioxa- 4-methyl-7-octenesulfonic acid copolymer, 5% by weight) and lithium fluoride (LiF, 99.995%) were purchased from Sigma-Aldrich.

TPBi (2,2',2"-(1,3,5-Benzenetriyl)-tris(1-phenyl-1-H-benzimidazole),>98.0%) was purchased from TCI Chemicals.

In addition, PEDOT:PSS (poly(3,4-ethylenedioxythiophene)-poly(styrenesulfonate), PH500) was purchased from CLEVIOS™.

Methanol, ethanol and acetone were purchased from SAMCHUN CHEMICALS, and all reagents were used without purification.

2. Preparation of Self-Organized Conducting Polymer (SOCP)

SOCP solution was prepared by mixing PEDOT:PSS and PFI in a ratio of 1:11.2, and then adding a small amount of DMSO thereto.

The SOCP solution was spin-coated on a cleaned ITO glass substrate at 2000 rpm for 60 seconds, followed by heat treatment on a 150° C. hot plate for 30 minutes.

3. Preparation of Perovskite Precursor Solution

First, a $PbBr_2$/HBr solution (3.67 g/8 mL) and $CsBr/H_2O$ solution (2.12 g/3 mL) were reacted to prepare a $CsPbBr_3$ perovskite powder.

The orange $CsPbBr_3$ perovskite powder in the solution was recovered by filtration, then dissolved in DMSO, recrystallized from ethanol and dried in a vacuum oven at 60° C. for 12 hours.

A $CsPbBr_3$ perovskite precursor solution was prepared by completely dissolving a $CsPbBr_3$ perovskite powder (2 mmol, 1.160 g) in a mixed solution of DMSO (8 mL) and DMF (2 mL) at 60° C.

A $Cs_4PbBr_6$ perovskite precursor solution was prepared by completely dissolving the $CsPbBr_3$ perovskite powder (0.25 mmol, 0.145 g) and the $CsPbBr_3$ perovskite powder (0.5 mmol, 0.107 g) in DMSO (10 mL) at 60° C., and then further adding methanol (1 mL) thereto.

4. Fabrication of Perovskite Layer Including Graded Wall Thereon

The perovskite precursor solution was deposited by an ultrasonic spray coating system in the atmosphere.

An ultrasonic spray nozzle was manufactured by CERA-TORQ, and the operation frequency thereof was 80 kHz.

A vortex air deflector was mounted on an ultrasonic spray nozzle to improve the uniformity and applicability of the perovskite layer.

The perovskite precursor solution was directly supplied through an ultrasonic spray nozzle of a syringe pump (KDS 100, KD Scientific, $CsPbBr_3$ perovskite precursor solution: 0.7 mL/min, $Cs_4PbBr_6$ perovskite precursor solution: 1.0 mL/min).

As a carrier gas for carrying droplets of the perovskite precursor solution to a substrate, $N_2$ gas was used.

The pressure of $N_2$ gas and the distance between the nozzle and the substrate were respectively set to 7 psi and 50 mm which were constantly maintained in all deposition processes.

A deposition temperature was 150° C.

5. Fabrication of Perovskite Photoelectric Device

The patterned ITO glass substrate (ITO substrate=25 mm×25 mm, etching area=10 mm×25 mm) was sequentially washed with a cleaning solution, deionized water, acetone and ethanol, and then dried with compressed $N_2$ gas.

The cleaned ITO glass substrate was treated with argon (Ar) plasma for 1 minute to remove organic residues and to make the surface hydrophilic.

A hole transport layer was formed by spin-coating a SOCP solution on the ITO glass substrate with a hydrophilic surface and then annealing the same.

A $Cs_4PbBr_6$ graded wall and a $CsPbBr_3$ perovskite layer were formed on the hole transport layer by an ultrasonic spray coating system.

The thicknesses of the perovskite layer and the graded wall were controlled by a spray coating time ($CsPbBr_3$=300 sec, $Cs_4PbBr_6$=0, 10, 20 and 30 sec).

After depositing the perovskite layer and the graded wall, an electron transport layer and a second electrode were formed by sequentially depositing 70 nm of TPBi, 1 nm of LiF, and 60 nm of Al by a high vacuum thermal evaporator at <$10^{-6}$ Torr. Here, deposition rates thereof were respectively 0.5, 0.1 and 2 Å/s (Angstroms per second).

An active region was fixed to 0.16 $cm^2$, and all devices were encapsulated prior to measurement in an $N_2$ atmosphere.

EXAMPLES AND COMPARATIVE EXAMPLE

Example 1

A $Cs_4PbBr_6$ perovskite precursor solution was spray-coated on a hole transport layer for 10 seconds to form a graded wall, and then a perovskite layer was formed on the graded wall, thereby fabricating a perovskite photoelectric device.

Example 2

A perovskite photoelectric device was fabricated in the same manner as in Example 1, except that a $Cs_4PbBr_6$ perovskite precursor solution was spray-coated for 20 seconds.

Example 3

A perovskite photoelectric device was fabricated in the same manner as in Example 1, except that a $Cs_4PbBr_6$ perovskite precursor solution was spray-coated for 30 seconds.

Comparative Example

A $CsPbBr_3$ perovskite precursor solution was spray-coated on a hole transport layer, thereby forming a perovskite photoelectric device including a perovskite layer.

The examples and the comparative example were summarized in Table 1 below according to the presence or absence of a graded wall and the spray coating time.

TABLE 1

| Classification | Presence or absence of graded wall | Number of graded walls | Spray coating time |
|---|---|---|---|
| Comparative Example ($CsPbBr_3$) | X | 0 | — |
| Example 1 (G-wall 10 s) | O | 1 | 10 seconds |
| Example 2 (G-wall 20 s) | O | 1 | 20 seconds |
| Example 3 (G-wall 30 s) | O | 1 | 30 seconds |

Here, G-wall 10s of Example 1 means that the $Cs_4PbBr_6$ perovskite precursor solution was spray-coated for 10 sec to form a graded wall (G-wall), G-wall 20s of Example 2 means that the $Cs_4PbBr_6$ perovskite precursor solution was spray-coated for 20 sec to form a graded wall (G-wall), and G-wall 30s of Example 3 means that the $Cs_4PbBr_6$ perovskite precursor solution was spray-coated for 30 sec to form a graded wall (G-wall).

Characteristic Evaluation

FIG. 3A illustrates a scanning electron microscope (SEM) image, photographed in a plan view, of a perovskite photoelectric device according to a comparative example of the present invention, FIG. 3B illustrates an SEM image, photographed in a plan view, of a perovskite photoelectric device including a graded wall formed thereon according to Example 1 of the present invention, FIG. 3C illustrates an SEM image, photographed in a plan view, of a perovskite photoelectric device including a graded wall formed thereon according to Example 2 of the present invention, and FIG. 3D illustrates an SEM image, photographed in a plan view, of a perovskite photoelectric device including a graded wall formed thereon according to Example 3 of the present invention.

Referring to FIGS. 3A to 3D, it can be confirmed that the diameter of crystal grains on an upper surface gradually increases as the spray coating time with the $Cs_4PbBr_6$ perovskite precursor solution increases.

The crystal particle size gradually increased with increasing spray coating time with the $Cs_4PbBr_6$ perovskite precursor solution is due to repeated crystal particle dissolution and regrowth by balancing the internal and external fluxes of the solvent in the diluted $Cs_4PbBr_6$ perovskite precursor solution during the spray coating process.

FIG. 4A illustrates an SEM image of a cross-section of a perovskite photoelectric device according to the comparative example of the present invention, FIG. 4B illustrates an SEM image of a cross-section of a perovskite photoelectric device including a graded wall formed thereon according to Example 1 of the present invention, FIG. 4C illustrates an SEM image of a cross-section of a perovskite photoelectric device including a graded wall formed thereon according to Example 2 of the present invention, and FIG. 4D illustrates an SEM image of a cross-section of a perovskite photoelectric device including a graded wall formed thereon according to Example 3 of the present invention.

Referring to FIGS. 4A to 4D, it can be confirmed that the thickness of the graded wall formed on the perovskite layer is not significantly changed regardless of the spray coating time.

This is because a $Cs_4PbBr_6$ perovskite precursor solution at a low concentration was used for spray coating.

FIG. 5A is a time-of-flight secondary ion mass spectroscope (TOF-SIMS) graph illustrating a compositional depth profile of a perovskite photoelectric device according to the comparative example of the present invention, FIG. 5B is a TOF-SIMS graph illustrating a compositional depth profile of a perovskite photoelectric device including a graded wall formed thereon according to Example 1 of the present invention, FIG. 5C is a TOF-SIMS graph illustrating a compositional depth profile of a perovskite photoelectric device including a graded wall formed thereon according to Example 2 of the present invention, and FIG. 5D is a TOF-SIMS graph illustrating a compositional depth profile of a perovskite photoelectric device including a graded wall formed thereon according to Example 3 of the present invention.

Here, TOF-SIMS was analyzed by an oxygen ion sputtering beam (1 keV) and a $Bi^+$ pulsed primary ion beam (25 keV).

In addition, Cs, Pb, Br and In shown in FIGS. 5A to 5D respectively denote cesium, lead, bromine and tin.

Referring to FIGS. 5A to 5D, to measure the compositional depth profile of the perovskite layer including a graded wall formed thereon according to a spray coating time with the $Cs_4PbBr_6$ perovskite precursor solution, TOF-SIMS was measured using an oxygen-ion sputtering beam for etching and a $Bi^+$ pulsed primary ion beam.

As shown in FIG. 5A, when the compositional depth profile from a top surface of the perovskite layer including a graded wall formed thereon to a bottom surface of the ITO glass substrate was detected, a constant compositional depth profile of cesium (Cs), lead (Pb) and bromine (Br) was shown.

Conversely, it can be confirmed that, as shown in FIGS. 5B to 5D, Examples 1 to 3 show the composition profiles of cesium and bromine around the top surface of the perovskite layer including a graded wall formed thereon, and the constant composition profile of lead.

Here, the thicknesses of the graded walls of Examples 1 to 3 were respectively ~17 nm, ~23 nm and ~37 nm.

A mixed region of $CsPbBr_3$ and $Cs_4PbBr_6$ is formed as the graded wall is formed on the perovskite layer, and the thickness of the mixed region increase with increasing spray coating time due to diffusion of $Cs_4PbBr_6$ by repeated dissolution and re-growth processes of the perovskite crystal particles.

That is, it can be confirmed that the perovskite layer on which a graded wall has been formed is thickly formed as the spray coating time increases to 10 seconds, 20 seconds and 30 seconds.

FIG. 6 illustrates the XRD patterns of perovskite photoelectric devices according to examples of the present invention and a comparative example.

Here, $CsPbBr_3$ denotes the perovskite photoelectric device according to the comparative example, and 10s, 20s and 30s denote the perovskite photoelectric devices according to Examples 1, 2 and 3 in the order.

Referring to FIG. 6, the XRD pattern of the perovskite layer according to the comparative example shows that the deposited $CsPbBr_3$ crystal particle has a cubic shape.

Particularly, referring to the XRD pattern enlarged at $2\theta=24\sim27°$ of FIG. 6, the $Cs_4PbBr_6$ perovskite phase appears as the $Cs_4PbBr_6$ perovskite precursor solution is spray-coated for 20 seconds or more.

It can be confirmed that the XRD peak at $2\theta=24\sim27°$ is the same as the XRD pattern of pure $Cs_4PbBr_6$ in the existing literature.

Such a result means that the graded wall formed by spray-coating the $Cs_4PbBr_6$ perovskite precursor solution for 20 seconds or more is covered by a pure $Cs_4PbBr_6$ phase, which is consistent with the TOF-SIMS results of FIGS. 5B to 5D.

FIG. 7A illustrates a time dependent-luminance change of a perovskite photoelectric device according to a comparative example of the present invention, and FIG. 7B illustrates a time dependent-luminance change of a perovskite photoelectric device according to Example 2 of the present invention.

At initial luminance ($L_0$) of 5000 cd/m$^2$, 4000 cd/m$^2$, 3000 cd/m$^2$, 2000 cd/m$^2$ and 1000 cd/m$^2$, a change in the luminance of each of the comparative example and Example 2 was observed for 100 hours.

In addition, the light emitting lifespan ($T_{90}$, at 100 cd/m$^2$) of each of the perovskite photoelectric devices according to the comparative example and Example 2 was calculated through Equation 1 below:

$$L_0^n T_{90} = \text{Constant} \qquad \text{[Equation 1]}$$

where $L_0$ denotes an initial luminance, n denotes an acceleration factor, and $T_{90}$ denotes a light emitting lifespan that is a time it takes for an initial light emission (time=0 hours) having a brightness of 100 cd/m² of a perovskite photoelectric device to decrease by 90%.

An acceleration factor may be determined by measuring T time according to light emission intensity. Accordingly, the acceleration factors of the comparative example and Example 2 were respectively determined to be 1.5266 and 1.5400.

Accordingly, the perovskite light emitting lifespans according to the comparative example and Example 2 were respectively calculated as 3656 hours and 4132 hours by Equation 1.

That is, it can be confirmed that the light emitting lifespan increases when the graded wall of the perovskite photoelectric device is formed.

Hereinafter, to prove the reason for improving durability of the perovskite photoelectric device according to the presence or absence of the graded wall, the compositional depth profile of the perovskite photoelectric device was observed at a luminance of 5000 cd/m² or less for 100 hours.

FIG. 8A is a TOF-SIMS graph illustrating a compositional depth profile according to a sputtering time for an initial state (t=0 h) of a perovskite photoelectric device according to a comparative example of the present invention, and FIG. 8B is a TOF-SIMS graph illustrating a compositional depth profile according to a sputtering time for a final state (t=100 h) of the perovskite photoelectric device according to the comparative example of the present invention.

Referring to FIGS. 8A and 8B, it can be confirmed that bromine (Br) moves to the hole transport layer as a bias voltage is applied to the hole transport layer of the comparative example.

FIG. 9A is a TOF-SIMS graph illustrating a compositional depth profile according to a sputtering time for an initial state (t=0 h) of a perovskite photoelectric device according to Example 2 of the present invention, and FIG. 9B is a TOF-SIMS graph illustrating a compositional depth profile according to a sputtering time for a final state (t=100 h) of the perovskite photoelectric device according to Example 2 of the present invention.

Referring to FIGS. 9A and 9B, it can be confirmed that bromine moves to the hole transport layer as a bias voltage is applied to the hole transport layer of Example 2, but a relatively small amount of bromine, compared to the comparative example, moves to the hole transport layer of Example 2.

It can be seen that, since the graded wall formed of $Cs_4PbBr_6$ having a greater number of monovalent anions than $CsPbBr_3$ of the perovskite layer is formed in Example 2, the bromine concentration of Example 2 is higher than that of the comparative example, so that a concentration barrier is generated and thus the movement of bromine is relatively less.

In conclusion, in the case of Example 2 wherein the graded wall is formed between the hole transport layer and the perovskite layer, the movement of bromine ions can be efficiently suppressed, so that the light emitting lifespan of the perovskite photoelectric device can be improved and thus the long-term stability thereof can be greatly improved.

Although the present invention has been described through limited examples and figures, the present invention is not intended to be limited to the examples. Those skilled in the art will appreciate that various modifications, additions and substitutions are possible, without departing from the scope and spirit of the invention. Therefore, it should be understood that there is no intent to limit the invention to the embodiments disclosed, rather, the invention is to cover all modifications, equivalents, and alternatives falling within the spirit and scope of the invention as defined by the claims.

The invention claimed is:

1. A perovskite photoelectric device, comprising:
a first electrode;
a hole transport layer formed on the first electrode;
a perovskite layer formed on the hole transport layer and made of a first perovskite compound;
an electron transport layer formed on the perovskite layer;
a second electrode formed on the electron transport layer; and
a graded wall formed on the hole transport layer and the perovskite layer and made of a second perovskite compound,
wherein the first perovskite compound and the second perovskite compound are represented by Formula 1 below,
the graded wall suppresses movement of anions comprised in the perovskite layer, and
wherein an anion concentration at the graded wall is higher than an anion concentration at the perovskite layer so that movement of anions comprised in the perovskite layer is suppressed:

$$A_aM_bX_c \quad \text{[Formula 1]}$$

where A is a monovalent cation, M is a divalent or trivalent metal cation, X is a monovalent anion, a+2b=c when M is a divalent metal cation, a+3B=c when M is a trivalent metal cation, and a, b and c are natural numbers.

2. The perovskite photoelectric device according to claim 1, wherein a size of voids of the graded wall is smaller than a size of anions comprised in the perovskite layer so that movement of anions comprised in the perovskite layer is suppressed.

3. The perovskite photoelectric device according to claim 2, wherein the graded wall further comprises at least one of inorganic thin films comprising a metal chalcogen compound, a metal oxide, a metal halide, and a metal thin film and organic thin films comprising a graphene thin film, a polymer thin film, a crosslinked polymer thin film, and a monomolecular thin film.

4. The perovskite photoelectric device according to claim 1, wherein the graded wall has a thickness of 0.5 nm to 100 µm.

5. The perovskite photoelectric device according to claim 1, wherein the perovskite photoelectric device has a light emitting lifespan ($T_{90}$, at 100 cd/m²) of 2,000 hours to 200,000,000 hours.

6. A method of fabricating the perovskite photoelectric device of claim 1, the method comprising:
forming the first electrode on a substrate;
forming the hole transport layer on the first electrode;
forming the graded wall made of the second perovskite compound on the hole transport layer;
forming the perovskite layer made of the first perovskite compound on the graded wall;
forming the electron transport layer on the perovskite layer; and
forming the second electrode on the electron transport layer,
wherein the first perovskite compound and the second perovskite compound are represented by Formula 1 below, and the graded wall suppresses movement of anions comprised in the perovskite layer, and wherein an anion concentration at the graded wall is higher than an anion concentration at the perovskite layer so that movement of anions comprised in the perovskite layer is suppressed:

$$A_a M_b X_c \quad \text{[Formula 1]}$$

where A is a monovalent cation, M is a divalent or trivalent metal cation, X is a monovalent anion, a+2b=c when M is a divalent metal cation, a+3B=c when M is a trivalent metal cation, and a, b and c are natural numbers.

7. The method according to claim 6, wherein the graded wall is formed by spray-coating the second perovskite compound on the hole transport layer.

8. The method according to claim 7, wherein the spray coating is performed for 0.1 seconds to 100,000 seconds.

9. The method according to claim 7, wherein a thickness of the graded wall is adjusted according to a time for which the spray coating is performed.

10. The method according to claim 9, wherein the graded wall has a thickness of 0.5 nm to 100 μm.

* * * * *